United States Patent
Chang et al.

(10) Patent No.: US 12,218,219 B2
(45) Date of Patent: Feb. 4, 2025

(54) SPACER STRUCTURE FOR SEMICONDUCTOR DEVICE

(71) Applicant: Taiwan Semiconductor Manufacturing Co., Ltd., Hsinchu (TW)

(72) Inventors: Jung-Hao Chang, Taichung (TW); Fo-Ju Lin, Keelung (TW); Fang-Wei Lee, Hsinchu (TW); Li-Te Lin, Hsinchu (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 636 days.

(21) Appl. No.: 17/459,788

(22) Filed: Aug. 27, 2021

(65) Prior Publication Data
US 2023/0068619 A1     Mar. 2, 2023

(51) Int. Cl.
*H01L 29/66* (2006.01)
*H01L 21/311* (2006.01)
*H01L 29/423* (2006.01)
*H01L 29/786* (2006.01)

(52) U.S. Cl.
CPC .. *H01L 29/66553* (2013.01); *H01L 21/31116* (2013.01); *H01L 29/42392* (2013.01); *H01L 29/66742* (2013.01); *H01L 29/78618* (2013.01); *H01L 29/78696* (2013.01)

(58) Field of Classification Search
CPC ............... H01L 29/42392; H01L 29/66553
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,954,058 B1 * | 4/2018 | Mochizuki ........ H01L 29/42392 |

* cited by examiner

*Primary Examiner* — Amar Movva
(74) *Attorney, Agent, or Firm* — Sterne, Kessler, Goldstein & Fox P.L.L.C.

(57) ABSTRACT

The present disclosure describes a semiconductor structure and a method for forming the same. The method can include forming a fin structure over a substrate. The fin structure can include first and second sacrificial layers. The method can further include forming a recess structure in a first portion of the fin structure, selectively etching the first sacrificial layer of a second portion of the fin structure over the second sacrificial layer of the second portion of the fin structure, and forming an inner spacer layer over the etched first sacrificial layer with the second sacrificial layer of the second portion of the fin structure being exposed.

20 Claims, 17 Drawing Sheets

SPACER STRUCTURE FOR SEMICONDUCTOR DEVICE

BACKGROUND

Advances in semiconductor technology has increased the demand for semiconductor devices with higher storage capacity, faster processing systems, higher performance, and lower costs. To meet these demands, the semiconductor industry continues to scale down the dimensions of semiconductor devices, such as nano-sheet field effect transistors (FETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
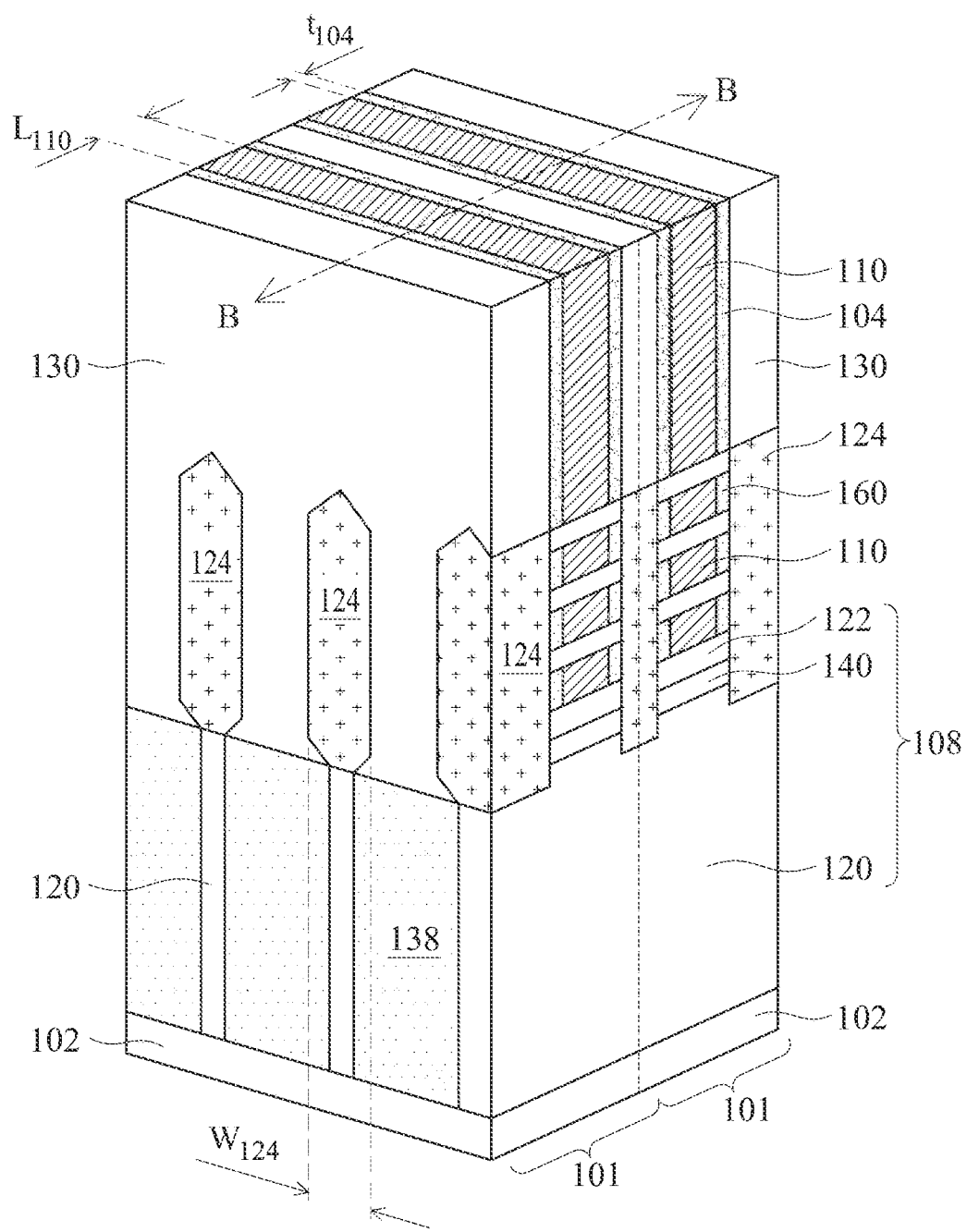
FIG. 1 is an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Fins associated with fin field effect transistors (finFETs) or gate-all-around (GAA) FETs can be patterned by any suitable method. For example, the fins can be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers can then be used to pattern the fins.

Technology advances in the semiconductor industry drive the pursuit of integrated circuits (ICs) having higher device density, higher performance, and lower cost. In the course of the IC evolution, nano-sheet transistors can replace planar FETs and finFETs to achieve ICs with higher device densities. Nano-sheet transistors can use a GAA gate structure to surround each nano-sheet channel layer to mitigate short channel effects. To further boost nano-sheet transistor performance, the nano-sheet transistor can incorporate a buried dielectric layer to physically separate the nano-sheet channel layers from the substrate to further suppress substrate leakage current. The process of forming the buried dielectric layer can include (i) performing an inner spacer formation process to form inner spacers to cover a top sacrificial layer (e.g., a silicon germanium layer with germanium atomic ratio about 30%), and (ii) replacing, via a lateral etching process and a deposition process, a bottom sacrificial layer (e.g., a silicon germanium layer with germanium atomic ratio about 15%) with the buried dielectric layer. The inner spacers can protect the top sacrificial layer when replacing the bottom sacrificial layer with the buried dielectric layer during the lateral etching process. However, the inner spacer formation can include an etching process with an insufficient etching selectivity to etch the top sacrificial layer over the bottom sacrificial layer. Accordingly, the inner spacer formation process may unintentionally form inner spacers to cover the bottom sacrificial layer and block the formation of the buried dielectric layer, thus degrading the IC's reliability and performance.

To address the aforementioned challenges, the present disclosure is directed to a fabrication method of an inner spacer for a gate-all-around field effect transistor (GAA FET). The process of forming the inner spacer can include epitaxially growing a bottom sacrificial layer over a substrate and epitaxially growing a top sacrificial layer over the bottom sacrificial layer. The top sacrificial layer and the bottom sacrificial layer can be silicon germanium layers. Further, the top sacrificial layer can have a greater germanium atomic concentration than the bottom sacrificial layer. The process of forming the inner spacer can further include forming a recess structure to expose side surfaces of the top sacrificial layer and the bottom sacrificial layer. The process of forming the inner spacer can further include performing a radical etching process to selectively etch the top sacrificial layer over the bottom sacrificial layer with an etching selectivity greater than about 5, such as from about 5 to about 100. The radical etching process can be performed with a fluorine-containing etchant, such as fluorine-containing radicals. Further, the radical etching process can be a hydrogen-free radical etching process to ensure a sufficient activation energy difference (e.g., greater than about 0.39 eV) of the etching reaction between on the top sacrificial layer and on the bottom sacrificial layer. With a sufficient etching selectivity provided by the radical etching process, the process of forming the inner spacer can selectively form inner spacer on the top sacrificial layer. The bottom sacrificial layer can be exposed after the process of forming the inner spacer, thus enabling the subsequent replacement process (e.g., etching process and deposition process) to replace the bottom sacrificial layer with the buried dielectric layer. A benefit of the present disclosure, among others, is to increase the yield of patterning the buried dielectric layer for the GAA FET, thus improving the IC's reliability and performance.

Figure 2:
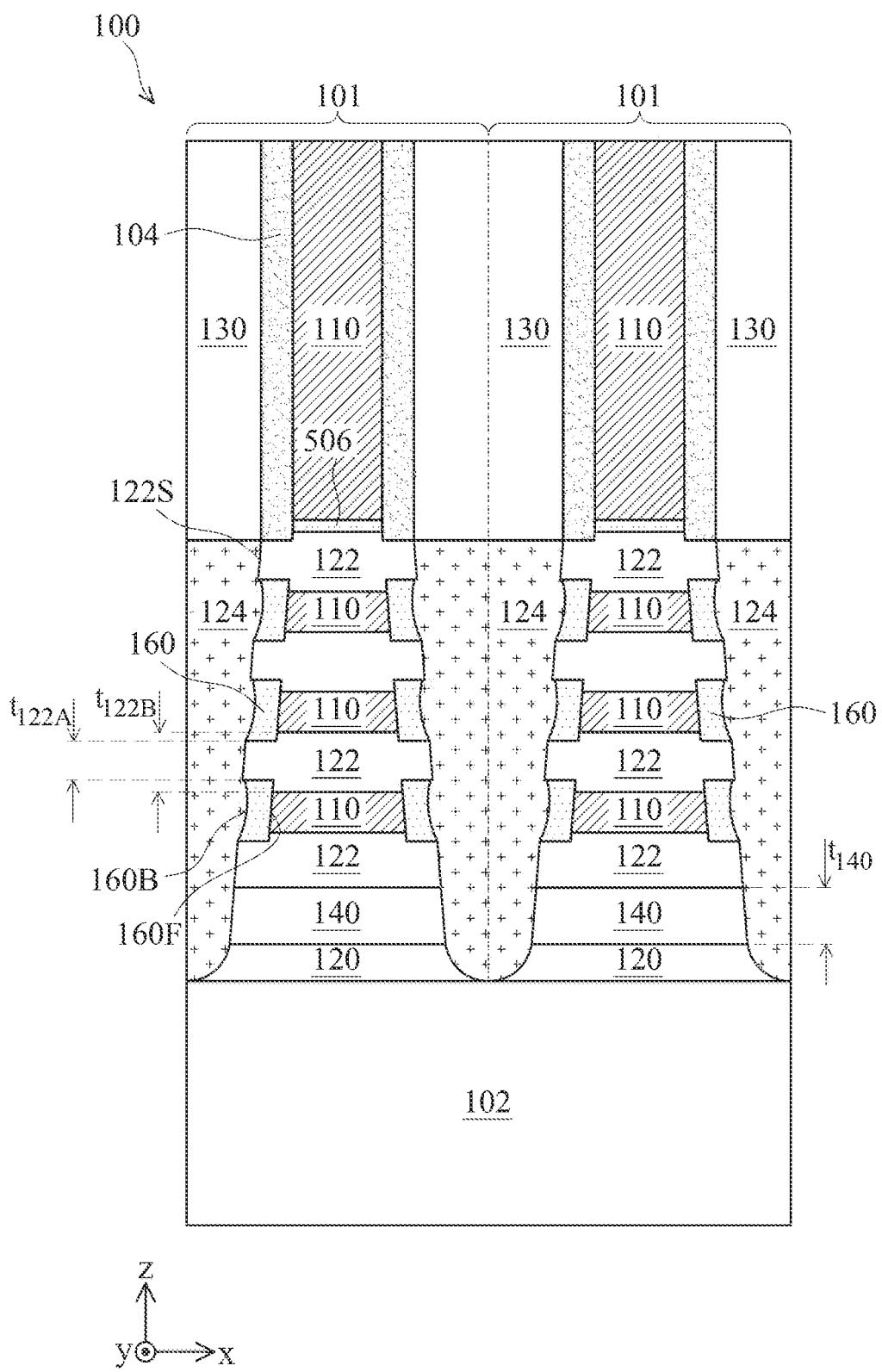
FIG. 2 is a cross-sectional view of a semiconductor device, according to some embodiments.

A semiconductor device 100 having multiple FETs 101 formed over a substrate 102 is described with reference to FIGS. 1 and 2, according to some embodiments. FIG. 1 illustrates an isometric view of semiconductor device 100, according to some embodiments. FIG. 2 illustrates a cross-sectional (e.g., along the x-z plane) view of semiconductor device 100 along line B-B of FIG. 1, according to some embodiments. The discussion of elements in FIGS. 1 and 2 with the same annotations applies to each other, unless mentioned otherwise. Semiconductor device 100 can be included in a microprocessor, memory cell, or other integrated circuit (IC). Also, each FET 101 shown in FIGS. 1 and 2 can be a GAA FET, according to some embodiments.

Referring to FIGS. 1 and 2, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus (P) or arsenic (As)).

FET 101 can include a fin structure 108 extending along an x-direction, a gate structure 110 traversing through fin structure 108 along a y-direction, and source/drain (S/D) regions 124 formed over portions of fin structure 108. Although FIG. 1 shows fin structure 108 accommodating two FETs 101, any number of FETs 101 can be disposed along fin structure 108. In some embodiments, FET 101 can include multiple fin structures 108 extending along a first horizontal direction (e.g., in the x-direction) and gate structure 110 traversing through the multiple fin structures 108 along a second horizontal direction (e.g., in the y-direction).

Fin structure 108 can include a buffer region 120 formed over substrate 102. Buffer region 120 can be made of materials similar to (e.g., lattice mismatch within 5%) substrate 102. In some embodiments, buffer region 120 can be made of identical materials as substrate 102. In some embodiments, buffer region 120 can be made of Si or SiGe. Buffer region 120 can be un-doped, doped with p-type dopants, doped with n-type dopants, or doped with intrinsic dopants.

Fin structure 108 can further include a buried dielectric layer 140 formed over substrate 102. In some embodiments, buried dielectric layer 140 can be formed over and in contact with substrate 102 (this embodiment is not shown in FIG. 2). In some embodiments, as shown in FIG. 2, buried dielectric layer 140 can be formed over buffer region 120. With buried dielectric layer 140 being formed over substrate 102 and/or over buffer region 120, FET 101's substrate leakage current that flows through buffer region 120 and/or substrate 102 can be reduced. Buried dielectric layer 140 can be made of any suitable electrically insulating material. In some embodiments, buried dielectric layer 140 can be made of silicon oxide, silicon nitride, or a low-k dielectric material with a dielectric constant less than about 3.9. Buried dielectric layer 140 can have a suitable thickness $t_{140}$ (shown in FIG. 2), such as about 10 nm. In some embodiments, buried dielectric layer 140's central portion (e.g., under gate structure 110) and edge portion (e.g., proximate to S/D region 124) can have substantially identical thicknesses $t_{140}$ to each other. Based on the disclosure herein, other materials and thicknesses for buried dielectric layer 140 are within the spirit and scope of this disclosure.

Fin structure 108 can further include one or more channel regions 122 formed over buried dielectric layer 140. Channel region 120 can be made of materials similar to (e.g., lattice mismatch within 5%) substrate 102. In some embodiments, channel region 122 can be made of Si or SiGe. In some embodiments, buffer region 120 and channel regions 122 can be both doped with p-type dopants or doped with n-type dopants. In some embodiments, channel region 122 can be wrapped by gate structure 110 to function as FET 101's channel. For example, a top surface, side surfaces, and a bottom surface of channel region 122 can be surrounded and in physical contact with gate structure 110. In some embodiments, channel region 122 (e.g., the bottommost channel region 122 shown in FIGS. 1 and 2) can be wrapped by gate structure 110 and buried dielectric layer 140 Channel region 122 can have a thickness $t_{122A}$ (e.g., from about 8 nm to about 13 nm) proximate to the adjacent S/D regions 124 and a thickness $t_{122B}$ (e.g., from about 10 nm to about 15 nm) away from the adjacent S/D regions 124. In some embodiments, thickness $t_{122B}$ can be greater than or substantially equal to thickness $t_{122A}$ due to the etching selectivity between channel region 122 and first sacrificial layers 422 of the radical etching process performed at operation 315 (discussed below). In some embodiments, as shown in FIG. 2, a horizontal (e.g., in the x-direction) dimension of channel region 122's bottom surface can be greater than that of channel region 122's top surface. In some embodiments, as shown in FIG. 2, a horizontal (e.g., in the x-direction) dimension of the bottommost channel region 122's bottom surface can be greater than that of another (e.g., another channel region 122 that is formed over the bottommost channel region 122) channel regions 122's bottom surface. In some embodiments, as shown in FIG. 2, a horizontal (e.g., in the x-direction) dimension of buried dielectric layer 140's bottom surface can be greater than that of channel region 122's bottom surface. Based on the disclosure herein, other materials and thicknesses for channel region 122 are within the spirit and scope of this di Gate structure 110 can be a multilayered structure (not shown in FIGS. 1 and 2) that wraps around channel region 122 and buried dielectric layer 140 to modulate FET 101. Gate structure 110 can have a suitable length $L_{110}$, such as from about 15 nm to about 50 nm, representing FET 101's channel length. Gate structure 110 can include a gate dielectric layer (not shown in FIGS. 1 and 2) and a gate electrode (not shown in FIGS. 1 and 2) disposed on the gate dielectric layer. The gate dielectric layer can include any suitable dielectric material with any suitable thickness that can provide channel modulation for FET 101. In some embodiments, the gate dielectric layer can be made of silicon oxide or a high-k dielectric material (e.g., hafnium oxide or aluminum oxide). In some embodiments, the gate dielectric layer can have a thickness ranging from about 1 nm to about 5 nm. Based on the disclosure herein, other materials and thicknesses for the gate dielectric layer are within the spirit and scope of this disclosure. The gate electrode can function as a gate terminal for FET 101. The gate electrode can include any suitable conductive material that provides a suitable work function to modulate FET 101. In some embodiments, the gate electrode can be made of titanium nitride, tantalum nitride, tungsten nitride, titanium, aluminum, copper, tungsten, tantalum, copper, or nickel. Based on the disclosure herein, other materials for the gate electrode are within the spirit and scope of this disclosure.

S/D regions 124 can be formed over opposite sides (e.g., along x-direction) of channel region 122, opposite sides of gate structure 110, and opposite sides of buried dielectric layer 140. S/D regions 124 can be physically contact with channel region 122 and buried dielectric layer 140. S/D regions 124 can be made of an epitaxially-grown semiconductor material similar to (e.g., lattice mismatch within 5%) channel region 122. In some embodiments, S/D regions 124 can be made of Si, Ge, SiGe, InGaAs, or GaAs. S/D regions 124 can be doped with p-type dopants, n-type dopants, or intrinsic dopants. In some embodiments, S/D region 124 can have a different doping type from channel region 122.

Semiconductor device 100 can further include a gate spacer 104 formed between gate structure 110 and S/D region 124. In some embodiments, gate spacer 104 can be further formed over fin structure 108's side surface. Gate spacer 104 can be made of any suitable dielectric material. In some embodiments, gate spacer 104 can be made of silicon oxide, silicon nitride, or a low-k material with a dielectric constant less than about 3.9. In some embodiments, gate spacer 104 can have a suitable thickness $t_{104}$, such as from about 5 nm to about 15 nm. Based on the disclosure herein, other materials and thicknesses for gate spacer 104 are within the spirit and scope of this disclosure.

Semiconductor device 100 can further include shallow trench isolation (STI) regions 138 to provide electrical isolation between fin structures 108. Also, STI regions 138 can provide electrical isolation between FET 101 and neighboring active and passive elements (not shown in FIGS. 1 and 2) integrated with or deposited on substrate 102. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. Based on the disclosure herein, other dielectric materials for STI region 138 are within the spirit and scope of this disclosure.

Semiconductor device 100 can further include an interlayer dielectric (ILD) layer 130 to provide electrical isolation to structural elements it surrounds or covers, such as gate structure 110 and S/D regions 124. In some embodiments, gate spacer 104 can be formed between gate structure 110 and ILD layer 130. ILD layer 130 can include any suitable dielectric material to provide electrical insulation, such as silicon oxide, silicon dioxide, silicon oxycarbide, silicon oxynitride, silicon oxy-carbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the spirit and scope of this disclosure.

Semiconductor device 100 can further include an inner spacer 160 formed protruding into fin structure 108. Inner spacer 160 can separate gate structure 110 from S/D region 124. For example, inner spacer 160 can be formed at gate structure 110's opposite sides along FET 101's channel direction (e.g., along the x-direction) to separate gate structure 110 from S/D region 124. In some embodiments, inner spacer 160 can be formed between two vertically (e.g., in the z-direction) adjacent channel regions 122. Inner spacer 160 can further have a front surface 160F proximate to gate structure 110. In some embodiments, the term "vertical" or "vertically" can mean nominally perpendicular to the surface of a substrate. In some embodiments, front surface 160F can be substantially coplanar with gate structure 110. In some embodiments, front surface 160F can be a substantially planar surface or a curved surface. Inner spacer 160 can further have a back surface 160B proximate to S/D region 124. In some embodiments, back surface 160B can be substantially coplanar with S/D region 124. In some embodiments, back surface 160B can be a substantially planar surface or a curved surface. In some embodiments, back surface 160B can be an indented surface with respect to inner spacer 160's vertical (e.g., in the z-direction) adjacent channel region 122's side surface 122S. Inner spacer 160 can be made of any suitable insulating material, such as a low-k dielectric material, to electrically separate gate structure 110 from S/D region 124. In some embodiments, inner spacer 160 can be made of silicon nitride, silicon oxynitride (SiON), silicon oxycarbide (SiOC), silicon carbonitride (SiCN), silicon oxycarbonitride (SiOCN), and silicon oxynitridecarbide (SiONC). Based on the disclosure herein, other materials for inner spacer 160 are within the spirit and scope of this disclosure.

Figure 3:
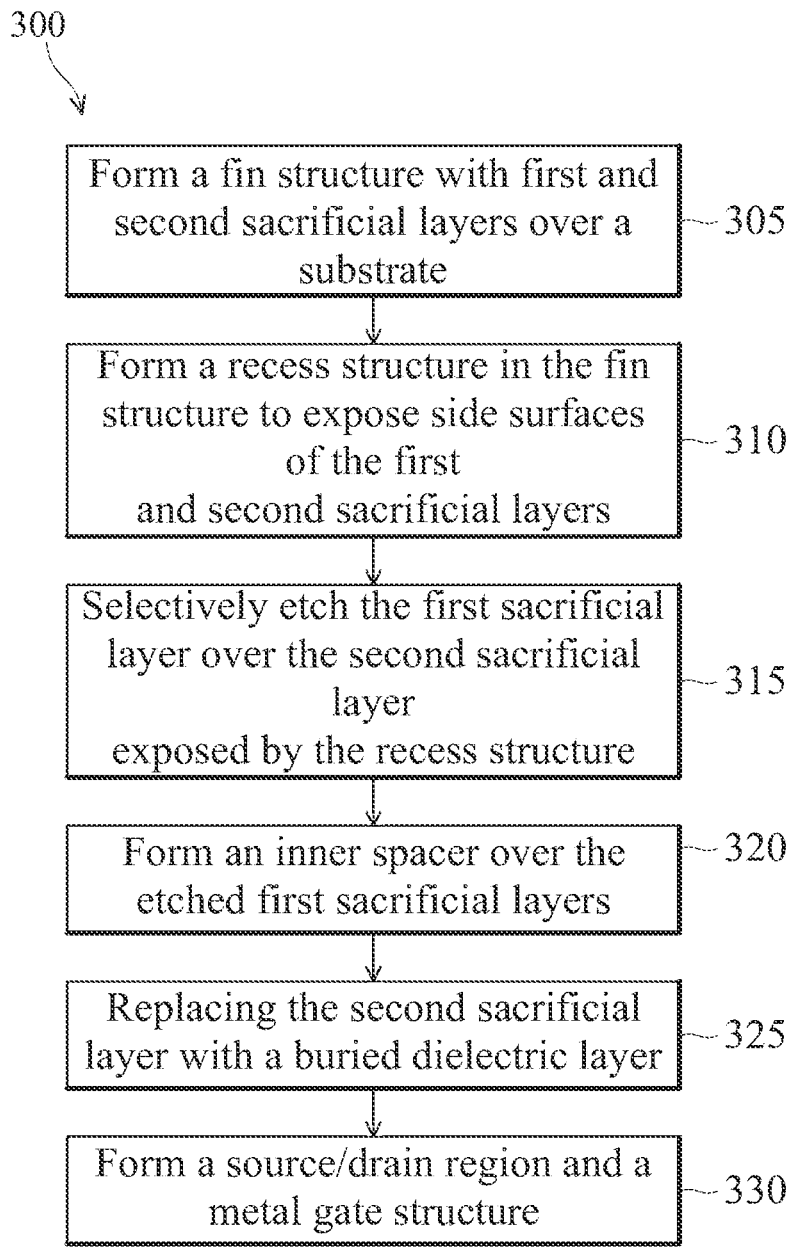
FIG. 3 is a flow diagram of a method for fabricating a semiconductor device, according to some embodiments.
Figure 4:
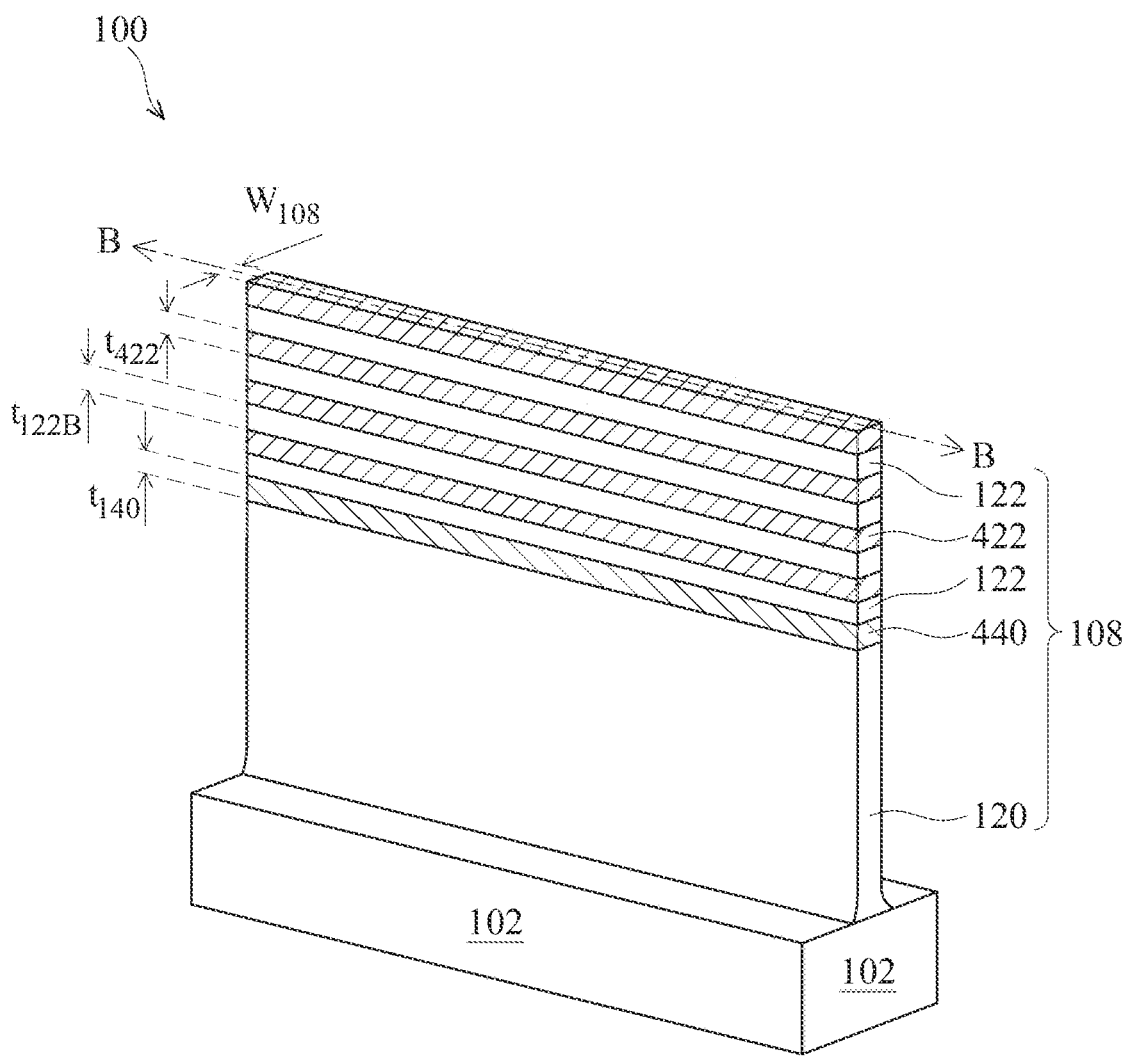
FIGS. 4 and 5 are isometric views of a semiconductor device at a stage of its fabrication process, according to some embodiments.
Figure 5:
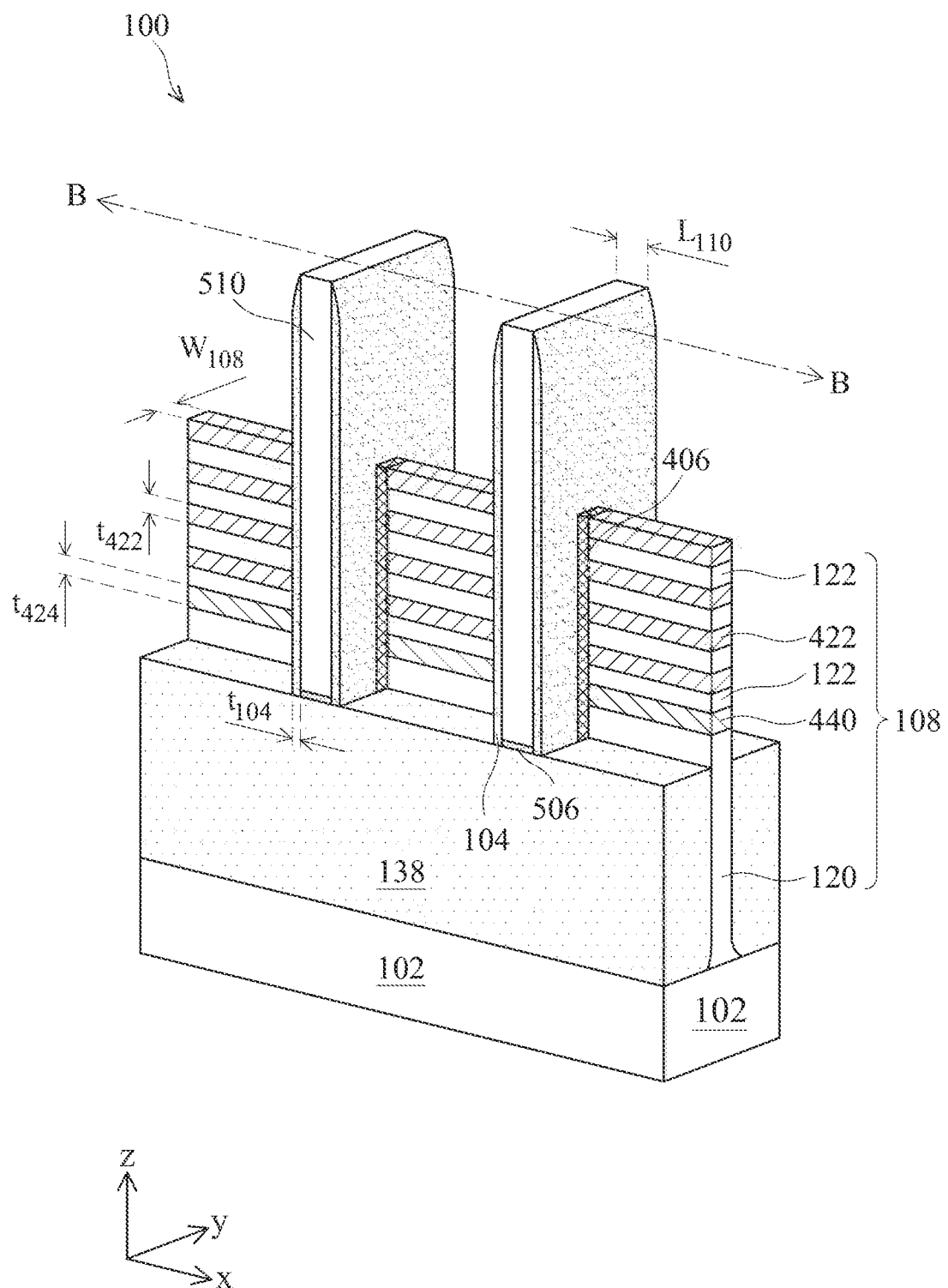

FIG. 3 is a flow diagram of a method 300 for fabricating semiconductor device 100, according to some embodiments. For illustrative purposes, the operations illustrated in FIG. 3 will be described with reference to the example fabrication process for fabricating semiconductor device 100 as illustrated in FIGS. 1 and 2. FIGS. 4 and 5 illustrates isometric views of semiconductor device 100 at various stages of its fabrication, according to some embodiments. FIGS. 6-17 illustrate cross-sectional views along line B-B of structure of FIG. 5 at various stages of its fabrication, according to some embodiments. Operations can be performed in a different order or not performed depending on specific applications. Method 300 may not produce a complete semiconductor device 100. Accordingly, it is understood that additional processes can be provided before, during, and/or after method 300, and that some other processes may be briefly described herein. Further, the discussion of elements in FIGS. 1, 2, and 4-17 with the same annotations applies to each other, unless mentioned otherwise.

Referring to FIG. 3, in operation 305, a fin structure with first and second sacrificial layers is formed over a substrate. For example, as shown in FIG. 4, fin structure 108 with a first sacrificial layer 422 and a second sacrificial layer 440 can be formed over substrate 102. The process of forming fin structures 108 can include (i) providing substrate 102; (ii) epitaxially growing second sacrificial layer 440 with thickness $t_{140}$ over substrate 102, (iii) epitaxially growing alternative stacks of channel regions 122 with thickness $t_{122B}$ and sacrificial layers 422 with a suitable thickness $t_{422}$, such as from about 5 nm to about 10 nm, over second sacrificial layer 440; and (iv) etching channel regions 122, first sacrificial layers 422, second sacrificial layer 440, and substrate 102 through a patterned mask layer (not shown in FIG. 4) using an etching process. In some embodiments, thickness $t_{422}$ can be substantially equal to thickness $t_{140}$.

First sacrificial layer 422 and second sacrificial layer 440 can be made of materials different from channel region 122 and similar to (e.g., lattice mismatch within 5%) substrate 102. In some embodiments, first sacrificial layer 422 and second sacrificial layer 440 can be made of SiGe, and channel region 122 can be made of Si. In some embodiments, first sacrificial layer 422 and second sacrificial layer 444 can have greater atomic percentage of Ge than channel region 122's atomic percentage of Ge. Further, first sacrificial layer 422 and channel region 122 can be made of SiGe with different atomic percentages of Ge from each other. Accordingly, first sacrificial layer 422 can have different etching selectivity from second sacrificial layer 440 during the process of forming inner spacer (discuss at operation 320). In some embodiments, first sacrificial layer 422 (e.g., $Si_{0.7}Ge_{0.3}$) can have a greater atomic percentage of Ge than second sacrificial layer 440 (e.g., $Si_{0.8}Ge_{0.15}$), such that first sacrificial layer 422 can be selectively etched over the second sacrificial layer 440 during the process of forming inner spacer (discuss at operation 320). In some embodiments, first sacrificial layer 422 can have a greater atomic percentage of Ge than second sacrificial layer 440 by from about 5% to about 25%, from about 10% to about 25%, from about 10% to about 20%, or from about 10% to about 15%. If the difference of Ge atomic percentages between first sacrificial layer 422 and second sacrificial layer 440 is below the above-noted lower limits, the etching selectivity between first sacrificial layer 422 and second sacrificial layer 440 may be insufficient to form buried dielectric layer 140 (discussed at operation 320 and 325). If the difference of Ge atomic percentages between first sacrificial layer 422 and second sacrificial layer 440 is beyond the above-noted upper limits, the lattice mismatch between first sacrificial layer 440 and second sacrificial layer 440 may be cause crystalline defects in channel regions 122, thus causing device failure for semiconductor device 100.

Channel region 122, first sacrificial layer 422, and second sacrificial layer 440 can be epitaxially grown using any suitable epitaxial growth process, such as a chemical vapor deposition (CVD) process, a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, a reduced pressure CVD (RPCVD) process, a molecular beam epitaxy (MBE) process, a cyclic deposition-etch (CDE) process, and a selective epitaxial growth (SEG) process. Based on the disclosure herein, other materials, thicknesses, and epitaxial growth processes for channel region 122, first sacrificial layer 422, and second sacrificial layer 440 are within the spirit and scope of this disclosure.

The etching process for removing channel region 122, first sacrificial layer 422, second sacrificial layer 440, and substrate 102 can include a dry etching process or a wet etching process to define fin structure 108 and buffer region 120 with a suitable width $W_{108}$, such as from about 5 nm to about 50 nm. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. Based on the disclosure herein, other widths and etching processes for fin structure 108 are within the spirit and scope of this disclosure.

Referring to FIG. 3, in operation 310, a recess structure is formed in the fin structure to expose side surfaces of the first and second sacrificial layers. For example, a recess structure 636 (shown in FIG. 6) can be formed in fin structure 108 to expose channel region 122's side surface 122S, first sacrificial layer 422's side surface 422S, and second sacrificial layer 440's side surface 440S with reference to FIGS. 5 and 6. The process of forming recess structure 636 can include (i) forming STI region 138 (shown in FIG. 5) over the etched substrate 102 using a deposition process and an etch back process; (ii) forming sacrificial gate structures 510 (shown in FIG. 5) with length $L_{110}$ over fin structures 108; and (iii) removing fin structures 108 through sacrificial gate structures 510 to form recess structure 636.

The deposition process for forming STI region 138 can include any suitable growth process, such as a physical vapor deposition (PVD) process, a CVD process, a high-density-plasma (HDP) CVD process, a flowable CVD (FCVD) process, and an atomic layer deposition (ALD) process. The etch back process for forming STI region 138 can include a dry etching process, a wet etching process, or a polishing process, such as chemical vapor deposition (CMP) process. Based on the disclosure herein, other processes for forming STI region 138 are within the spirit and scope of this disclosure.

The process of forming sacrificial gate structure 510 can include (i) blanket depositing a dielectric layer 506 with a suitable thickness, such as from about 1 nm to about 5 nm, over fin structures 108 using a suitable deposition process, such as a CVD process, a PVD process, and an ALD process; (ii) blanket depositing a polysilicon layer (not shown in FIG. 5) and a hard mask layer (not shown in FIG. 4) over dielectric layer 506 using a suitable deposition process, such as a CVD process, a PVD process, and an ALD process; (iii) removing dielectric layer 506, the polysilicon layer and the hard mask layer through a patterned mask layer (not shown in FIG. 5) using an etching process; and (iv) forming gate spacers 104 with a suitable thickness $t_{104}$, such as from about 5 nm to about 15 nm, over the polysilicon layer's side surfaces and/or over fin structure 108's side surfaces using a suitable deposition process and an etching process. Based on the disclosure herein, other processes for forming gate structures 510 are within the spirit and scope of this disclosure.

Figure 6:
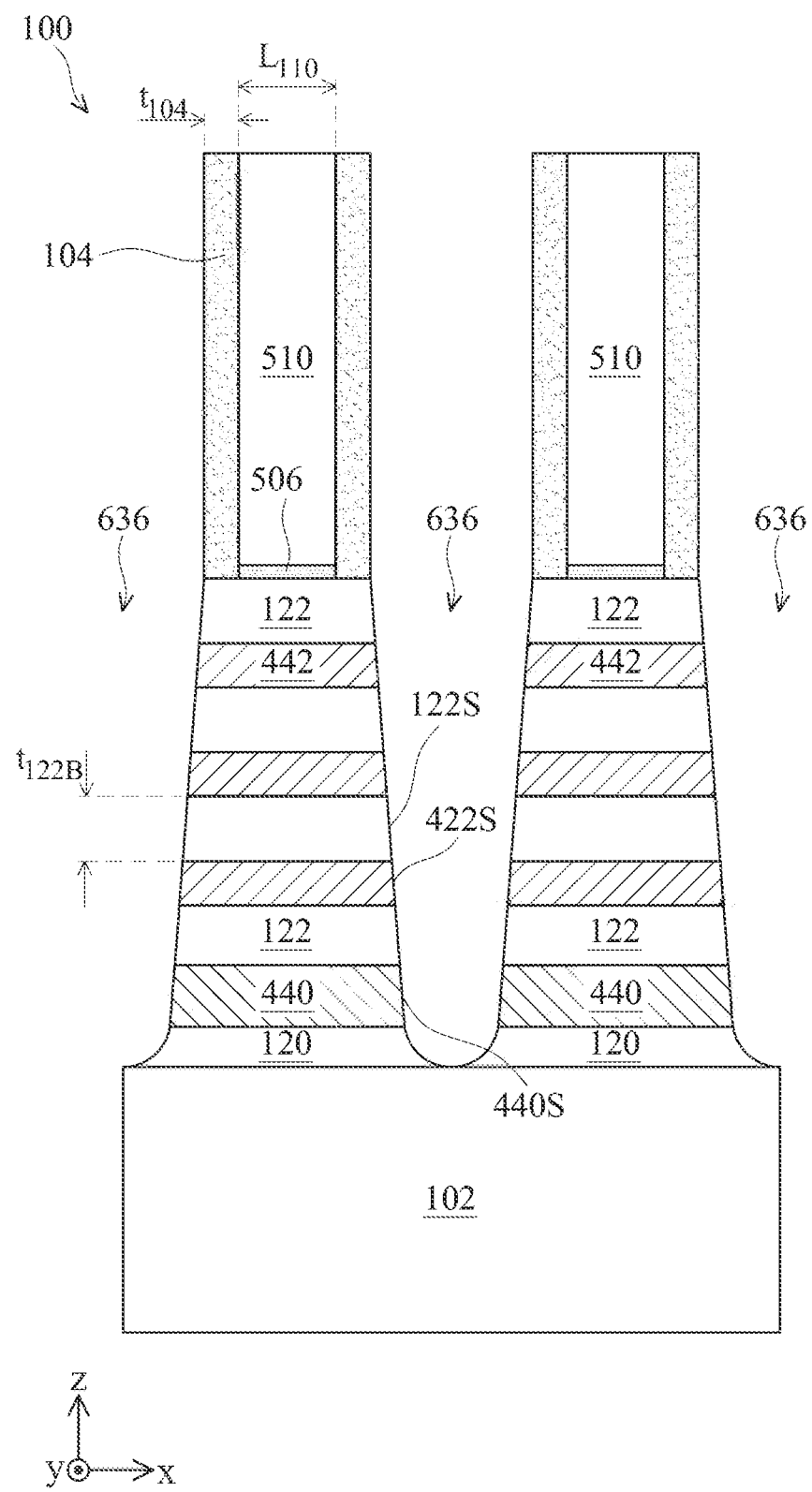
FIGS. 6-17 are cross-sectional views of a semiconductor device at various stages of its fabrication process, according to some embodiments.

Referring to FIG. 6, after forming sacrificial gate structure 410, recess structure 636 can be formed by removing channel regions 122, first sacrificial layers 422, second sacrificial layer 440, and substrate 102 through sacrificial gate structures 510 and gate spacers 104 using an etching process. The etching process can include a dry etching process or a wet etching process. In some embodiments, the etching process can be a time-etching process. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. As shown in FIG. 6, the resulting recess structure 636 can expose fin structure 108's side surface, such as exposing first sacrificial layers 422's side surfaces 422S, exposing second sacrificial layer 440's side surface 440S, and exposing channel region 122's side surface 122S. Further, the resulting recess structure 636 can expose gate spacers 104's side surfaces. In some embodiments, the resulting recess structure 636 can expose buffer region 120's side surface. In some embodiments, side surfaces 422S, 440S and 122S formed by operation 310 can be substantially coplanar with one another.

Figure 7:
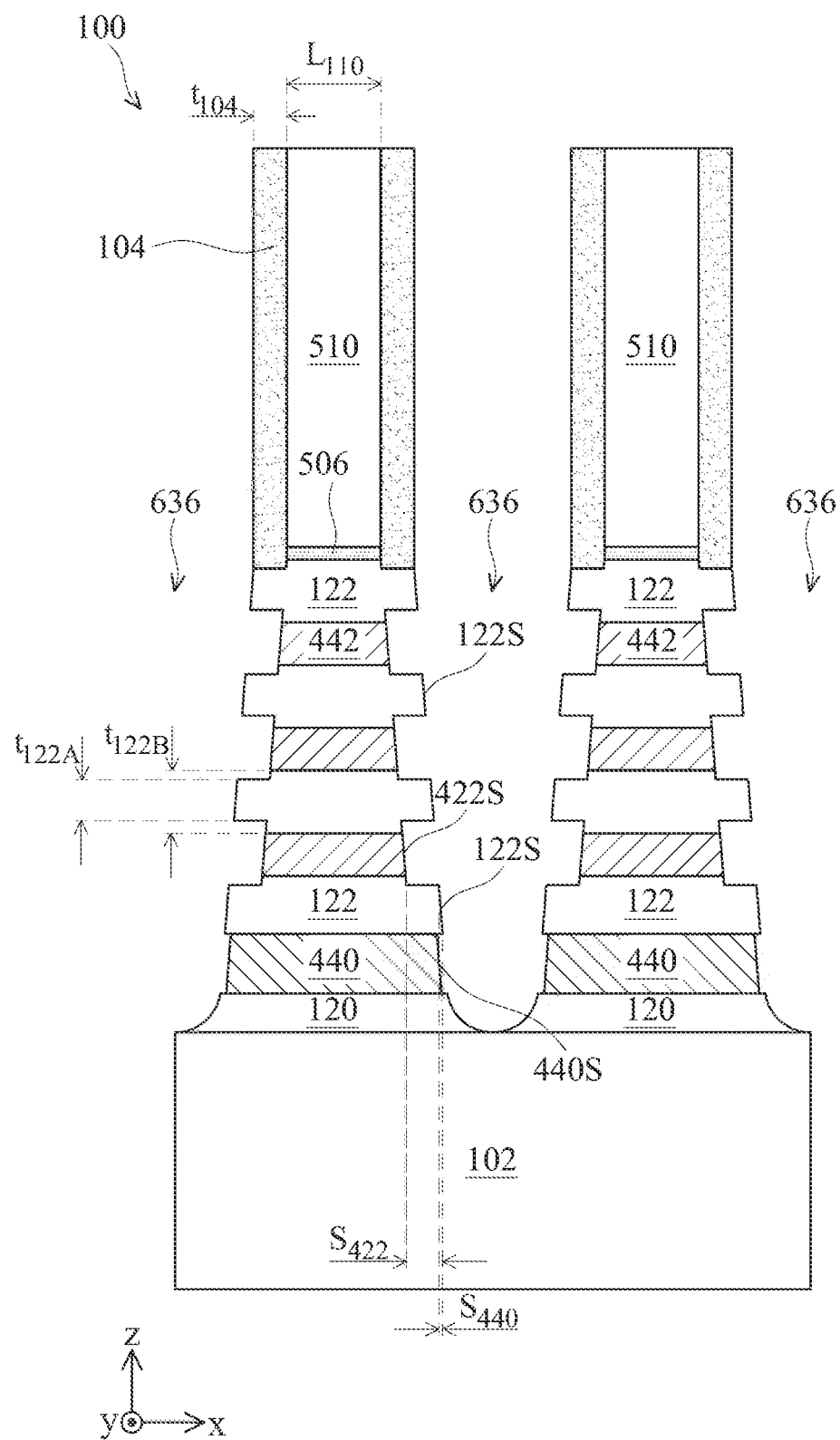

Referring to FIG. 3, in operation 315, the first sacrificial layer exposed by the recess structure is selectively etched over the second sacrificial layer exposed by the recess structure. For example, as shown in FIG. 7, first sacrificial layers 422 exposed by recess structure 636 can be selectively etched over second sacrificial layer 440 exposed by recess structure 636 by performing a radical etching process on the structure of FIG. 6. The radical etching process can etch first sacrificial layer 422 with a lateral (e.g., along the x-direction) etching depth $S_{422}$. In some embodiments, lateral etching depth $S_{422}$ can be substantially equal to spacer 104's thickness $t_{104}$, such that gate structure 110 formed over channel regions 122 and gate structure 110 formed between channel regions 122 can have substantially identical length $L_{110}$ to each other after method 300. The radical etching process may minimally etch second sacrificial layer 422 with a lateral etching depth $S_{440}$. In some embodiments, lateral etching depth $S_{440}$ can be less than about 1.5 nm. If etching depth $S_{440}$ is beyond the above-noted upper limit, inner spacer 160 (formed at operation 320) may be formed over second sacrificial layer 422's side surface 422S, thus inhibiting forming buried dielectric layer at operation 325.

In some embodiments, a ratio of lateral etching depth $S_{422}$ to lateral etching depth $S_{440}$ can be from about 10 to about 100. If the ratio of lateral etching depth $S_{422}$ to lateral etching depth $S_{440}$ is below the above-noted lower limit, inner spacer 160 (formed at operation 320) may be formed over second sacrificial layer 422's side surface 422S, thus inhibiting forming buried dielectric layer at operation 325. If the ratio of lateral etching depth $S_{422}$ to lateral etching depth $S_{440}$ is beyond the above-noted upper limits, the radical etching process may result in an increased etching depth $S_{422}$, thus causing gate structure 110 formed between channel regions 122 having an insufficient gate length to control FET 101's channel regions 122. In some embodiments, the ratio of lateral etching depth $S_{422}$ to lateral etching depth $S_{440}$ can be substantially equal to the ratio of the etching rate of etching first sacrificial layer 422 by the radical etching process to the etching rate of etching second sacrificial layer 440 by the radical etching process. In some embodiments, the ratio of the etching rate of etching first sacrificial layer 422 by the radical etching process to the etching rate of etching second sacrificial layer 440 can be referred to the etching selectivity of first sacrificial layer 422 over second sacrificial layer 440 in the radical etching process.

In some embodiments, the radical etching process performed at operation 315 can selectively etch first sacrificial layer 422 over channel region 122, thus causing thickness $t_{122B}$ greater than or substantially equal to thickness $t_{122A}$ after operation 315. In some embodiments, the difference between thickness $t_{122B}$ and thickness $t_{122A}$ can be substantially equal to lateral etching depth $S_{440}$.

The process of performing the radical etching process to selectively etch first sacrificial layer 422 over second sacrificial layer 440 can include (i) providing a processing gas that contains a halogen element, such as containing fluorine, (ii) providing a noble gas, such as argon (Ar), to mix with the processing gas; and (iii) performing, via a remote plasma source, an excitation process, a disassociation process, and/or an ionization process on the mixed processing gas and the noble gas to generate radicals that contain the halogen element. In some embodiments, the generated radicals can be ion-free radicals (e.g., charge neutral radicals). The generated radicals can react with side surfaces (e.g., side surface 422S) of FIG. 6's fin structure 108 exposed by recess structures 636 to selectively etch first sacrificial layer 422 over second sacrificial layer 440 and selectively etch first sacrificial layer 422 over channel regions 122. In some embodiments, the processing gas can include nitrogen trifluoride ($NF_3$), fluorine gas ($F_2$), carbon tetrafluoride ($CF_4$), or sulfur hexafluoride ($SF_6$), where the respective halogen element contained in the processing gas can be a fluorine element (F). Accordingly, respective generated radicals can be fluorine-based radicals, such as $NF_3^*$, $NF_2^*$, $NF^*$, $F^*$, and $F_2^*$. As previously discussed, first sacrificial layer 422 and channel region 122 can be made of SiGe with different atomic percentages of Ge from each other. For example, first sacrificial layer 422 (e.g., $Si_{0.7}Ge_{0.3}$) can have a greater atomic percentage of Ge than second sacrificial layer 440 (e.g., $Si_{0.8}sGe_{0.15}$). The generated radicals (e.g., the above-noted fluorine-containing radicals) can react with a germanium-rich (e.g., germanium's atomic concentration greater than about 20%) surface (e.g., reacting with first sacrificial layer 422's side surface 422S) to form a volatile byproduct (e.g., germanium fluoride) at the activation energy (e.g., about 0 eV) lower than the activation energy (e.g., about 3.9 eV) of reacting with a germanium-poor (e.g., germanium's atomic concentration less than about 20%) surface (e.g., reacting with second sacrificial layer 440's side surface 440S) to form the volatile byproduct (e.g., germanium fluoride). The volatile byproduct (e.g., germanium fluoride) can then be evaporated from sacrificial layer 422, thus reducing first sacrificial layer 422's volume. The above-noted activation energy difference (e.g., about 3.9 eV) can ensure a greater etching rate of etching the germanium-rich surface (e.g., etching first sacrificial layer 422) than etching the germanium-poor surface (e.g., etching first sacrificial layer 422 and/or etching channel regions 122).

In some embodiments, the radical etching process can be an etching process that only adopts a single species of halogen to selectively etch first sacrificial layer 422 over second sacrificial layer 440. For example, the radical etching process can include providing one or more processing gases, each of the one or more processing gases (e.g., $NF_3$ and $F_2$) only including F element. If the one or more processing gases contain another halogen species, such as chlorine (Cl), the radical etching process may additionally include the other halogen-based radicals (e.g., Cl-based radicals) that may reduce the above-noted activation energy differences, thus degrading the etching selectivity between first sacrificial layer 422 and second sacrificial layer 440 in the radical etching process.

In some embodiments, the radical etching process can be a hydrogen-free etching process to selectively etch first sacrificial layer 422 over second sacrificial layer 440. Namely, the radical etching does not apply a hydrogen-containing processing gas, such as Trifluoromethane ($CHF_3$) which chemical formula includes hydrogen, to etch first sacrificial layer 422. If the processing gas of the radical etching process contains hydrogen, the radical etching process may additionally include the hydrogen-based radicals (e.g., H or $H_2$ radicals) that may reduce the above-noted activation energy differences, thus degrading the etching selectivity between first sacrificial layer 422 and second sacrificial layer 440 in the radical etching process.

In some embodiments, a ratio of the processing gas's flow rate (e.g., $NF_3$'s flow rate) and the noble gas's flow rate (e.g., Ar's flow rate) during the radical etching process can be from about 0.05 to about 1. If the ratio of the processing gas's flow rate (e.g., $NF_3$'s flow rate) and the noble gas's flow rate (e.g., Ar's flow rate) during the radical etching process is above these upper limit, the radical etching process may have insufficient noble gas to dissociate the processing gas's molecules to form the halogen-containing radicals (e.g., F-based radicals), thus degrading the overall etching rate of the radical etching process. If the ratio of the processing gas's flow rate (e.g., $NF_3$'s flow rate) and the noble gas's flow rate (e.g., Ar's flow rate) during the radical etching process is below these lower limits, the etching selectivity of the radical etching process may degrade due to insufficient halogen-containing radicals.

In some embodiments, the radical etching process can be performed at an operating temperature (e.g., the temperature of FIG. 6's semiconductor device 100) from about −90° C. to about 30° C. or from about −90° C. to about 15° C. If the operating temperature of performing the radical etching process is below the above-noted lower limits, the radical etching process's etching rate of etching first sacrificial layer 422 may be degraded. If the operating temperature of performing the radical etching process is beyond the above-noted upper limits, the radicals in the radical etching process may acquire sufficient thermal energy from the operating temperature to overcome the above-noted activation energy difference (e.g., about 0.39 eV) to greatly react with second sacrificial layer 440, thus degrading the etching selectivity between the first sacrificial layer 422 and second sacrificial layer 440 in the radical etching process.

Figure 8:
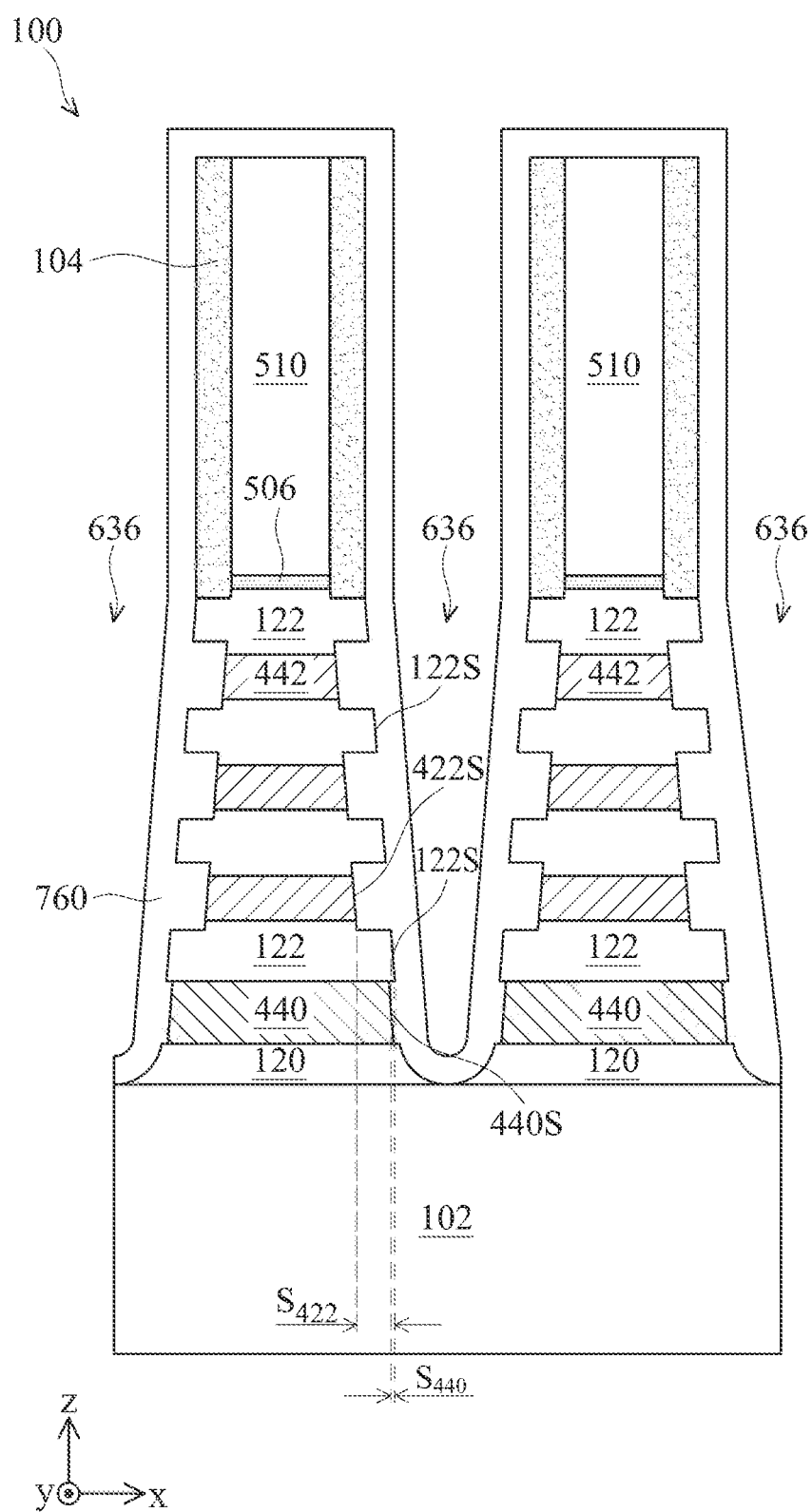

Referring to FIG. 3, in operation 320, an inner spacer is formed over the etched first sacrificial layers. For example, inner spacer 160 (shown in FIG. 9) can be formed over first sacrificial layer 422's side surfaces 422S with second sacrificial layer 440's side surface 440S being exposed. As shown in FIG. 8, the process of forming inner spacers 160 can include blanket depositing a dielectric layer 760 over first sacrificial layer 422's side surfaces 422S, over second sacrificial layer 440's side surface 440S, and over channel region 122's side surface 122S in recess structure 636 using a deposition process, such as a CVD process, a PVD process, and an ALD process. Dielectric layer 760 can have a suitable thickness, such as from 1 nm to about 5 nm, to conform to dielectric FIG. 7's fin structure 108's top and side surfaces. In some embodiments, the deposited dielectric layer 760 can have two opposite side surfaces horizontally (e.g., in the x-direction) separated from one another in recess structure 636.

Figure 9:
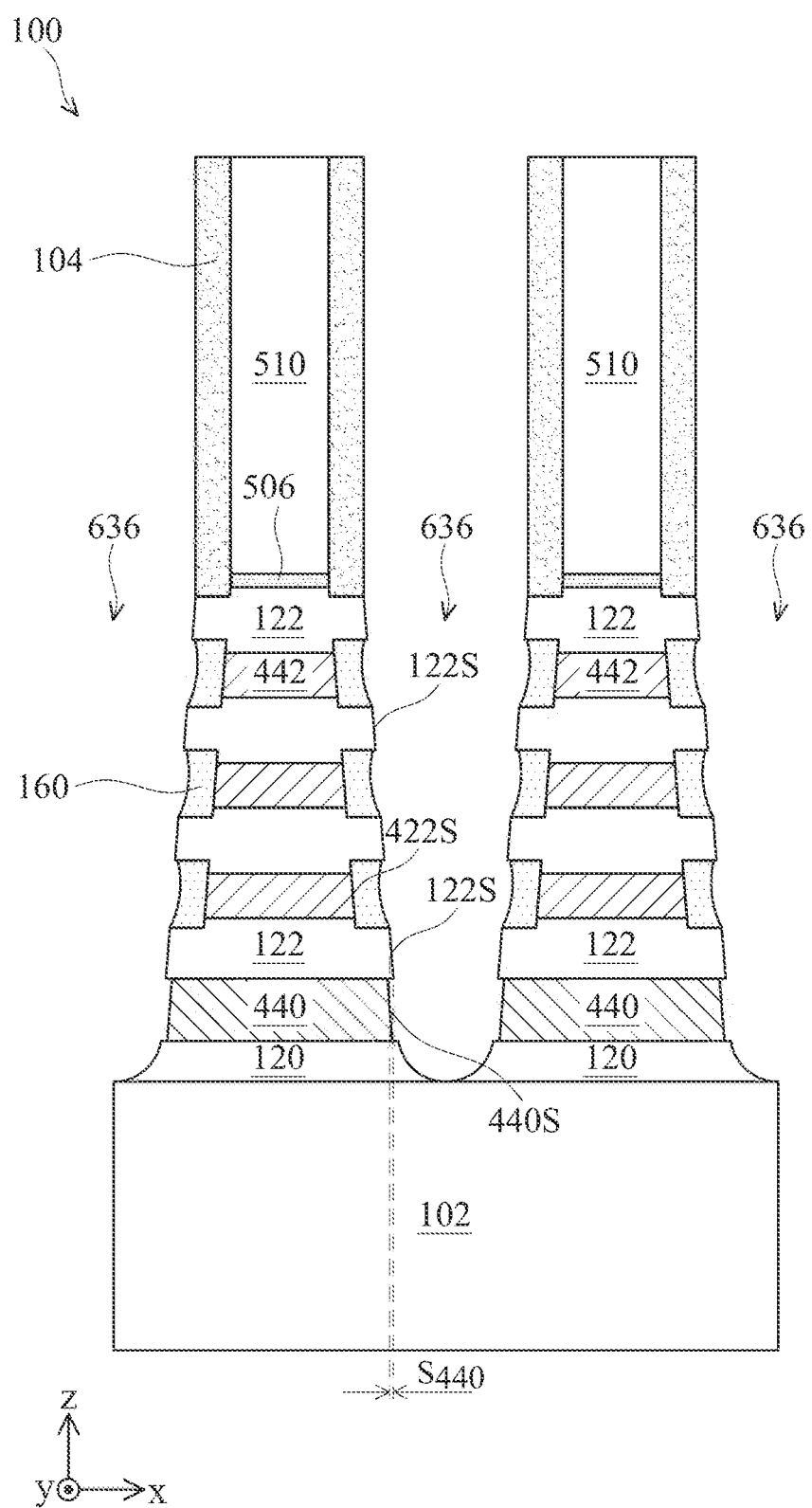

As shown in FIG. 9, the process of forming inner spacer 160 can further include performing a dry etching process to etch dielectric layer 760 to define inner spacer 160 over first sacrificial layer 422's side surfaces 422S with second sacrificial layer 440's side surface 440S and channel region 122's side surface 122S being exposed to recess structures 636. In some embodiments, the dry etching process for etching dielectric layer 760 can be a plasma-free dry etching process (e.g., providing the dry etchant gases to chemically react with dielectric layer 760 without applying a radio-frequency power to generate ions). In some embodiments, the dry etching process can be a radical etching process. Further, since the radical etching process performed at operation 315 can cause a negligible lateral etching depth $S_{440}$ (e.g., less than about 3 nm as previously discussed), the dry etching process for forming inner spacer 160 can completely remove dielectric layer 760 from second sacrificial layer 440's side surface 440S with first sacrificial layer 422's side surfaces 422S being capped by inner spacer 160. Therefore, side surface 440S can be exposed after forming inner spacer 160 at operation 320. In some embodiments, inner spacer 160's lateral (e.g., along x-direction) thickness can be substantially equal to the lateral etching depth $S_{422}$ defined by the radical etching process at operation 315. In some embodiments, the dry etching process for etching dielectric layer 760 can selectively etch dielectric layer 760 over channel region 122 with an etching selectivity from about 5 to about 50, from about 5 to about 30, or from about 5 to about 20. If the above-noted etching selectivity is below the above-noted lower limits, channel region 122's side surface 122S may be damaged by the dry/wet etching process, thus causing FET 101's leakage current. If the above-noted etching selectivity is beyond the above-noted upper limits, the resulting inner spacer 160 may have an insufficient thickness to avoid leakage current between FET 101's gate and source/drain terminals.

Figure 10:
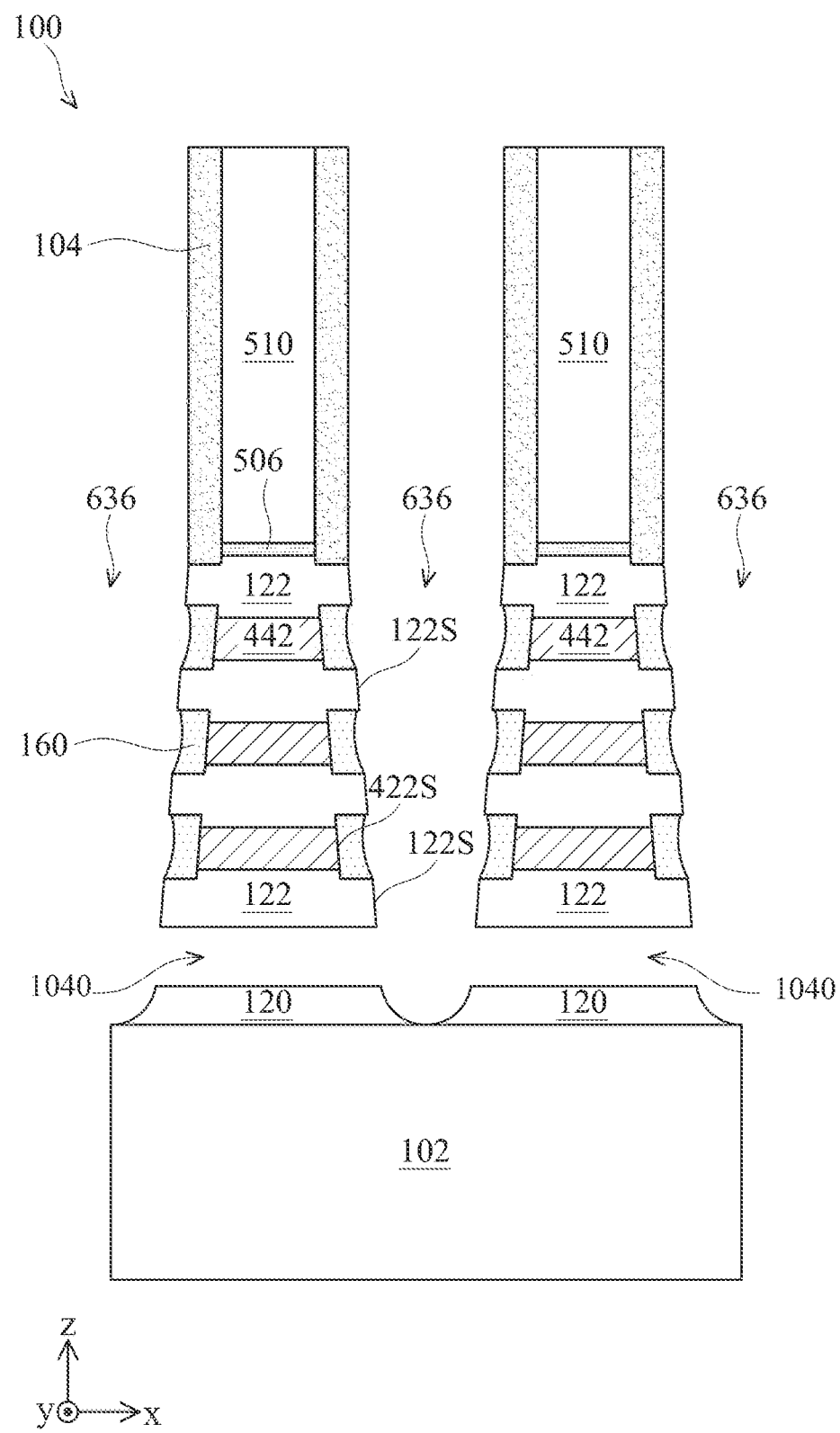

Referring to FIG. 3, in operation 325, the second sacrificial layer is replaced with a buried dielectric layer. For example, second dielectric layer 440 of FIG. 9 can be replaced with buried dielectric layer 140 of FIG. 12 with references to FIGS. 10-12. As shown in FIG. 10, the process of replacing second sacrificial layer 440 with buried dielectric layer 140 can include forming a cavity structure 1040 between the bottommost channel region 122 and buffer region 120 by performing an etching process to selectively remove second sacrificial layer 440 over channel regions 122. Cavity structure 1040 can connect recess structures 636 at opposite (e.g., in the x-direction) sides of channel regions 122 with channel regions 122 and first sacrificial layers 422 being anchored by sacrificial gate structures 510 in the y-direction (not shown in FIG. 10). As previously discussed, second sacrificial layer 440 (e.g., a SiGe layer, such as $Si_{0.85}Ge_{0.15}$) can have a greater germanium concentration than channel region 122 (e.g. a Si layer). The etching process for forming cavity structure 1040 can include a dry etching process or a wet etching that selectively etches SiGe over Si. The dry etching process or the wet etching process for forming cavity structure 1040 does not remove first sacrificial layers 422 because first sacrificial layer 422 are protected by inner spacer 160. In some embodiments, the dry etching process for forming cavity structure 1040 can include applying a mixture of gases of $HF/F_2$, or a mixture of $NF_3$ and hydrogen radical (H*). In some embodiments, the wet etching process for forming cavity structure 1040 can include applying a mixture of sulfuric acid ($H_2SO_4$) and hydrogen peroxide ($H_2O_2$) (SPM), or a mixture of ammonia hydroxide with $H_2O_2$ and water (APM).

Figure 11:
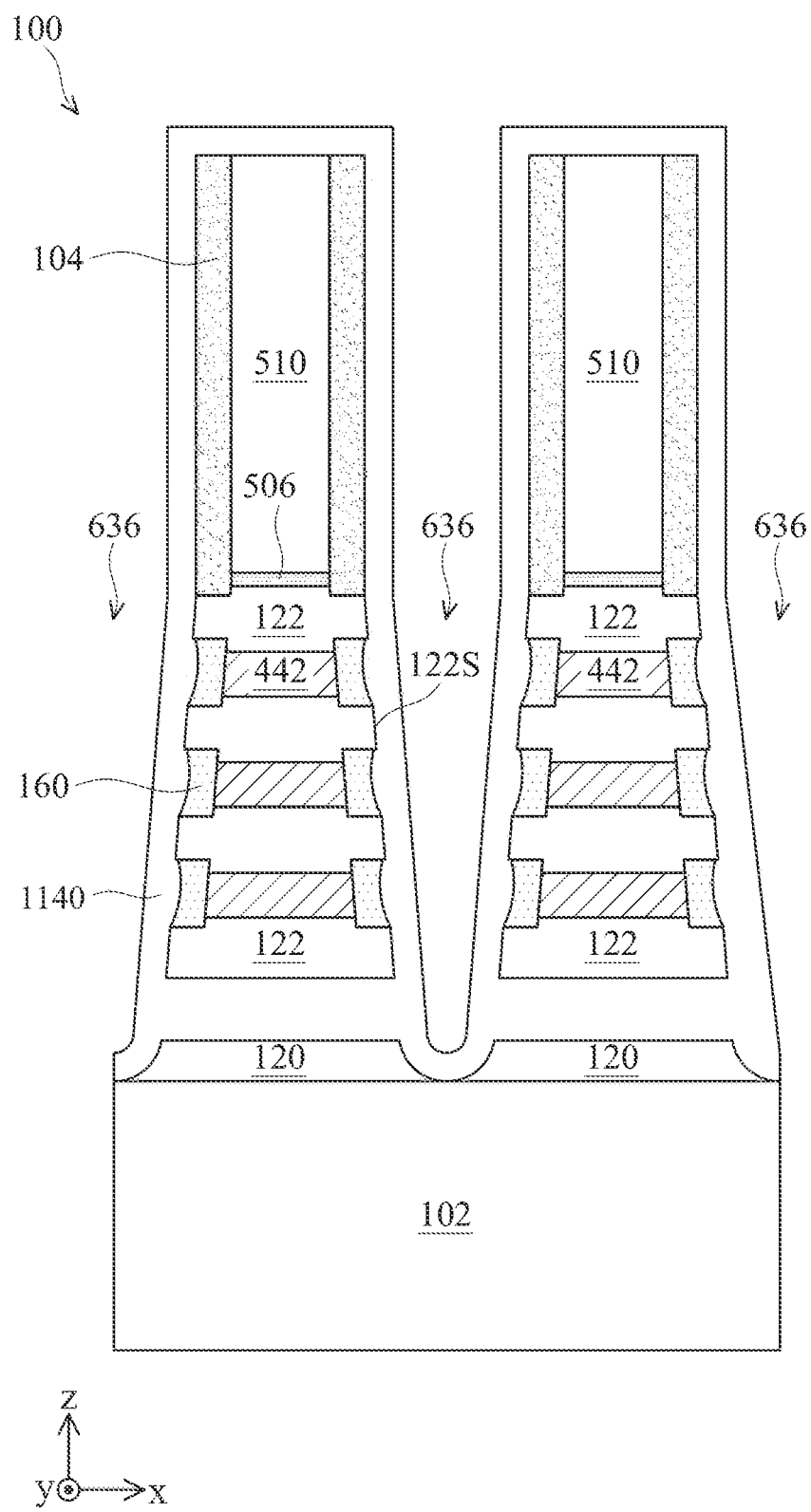

As shown in FIG. 11, the process of replacing second sacrificial layer 440 with buried dielectric layer 140 can further include blanket depositing a dielectric layer 1140 to fill cavity structure 1040, over inner spacers 160, and over channel region 122's side surface 122S of the structure of FIG. 10 using a deposition process, such as a CVD process, a PVD process, and an ALD process. In some embodiments, the deposited dielectric layer 1140 can have two opposite side surfaces horizontally (e.g., in the x-direction) separated from one another in recess structure 636.

Figure 12:
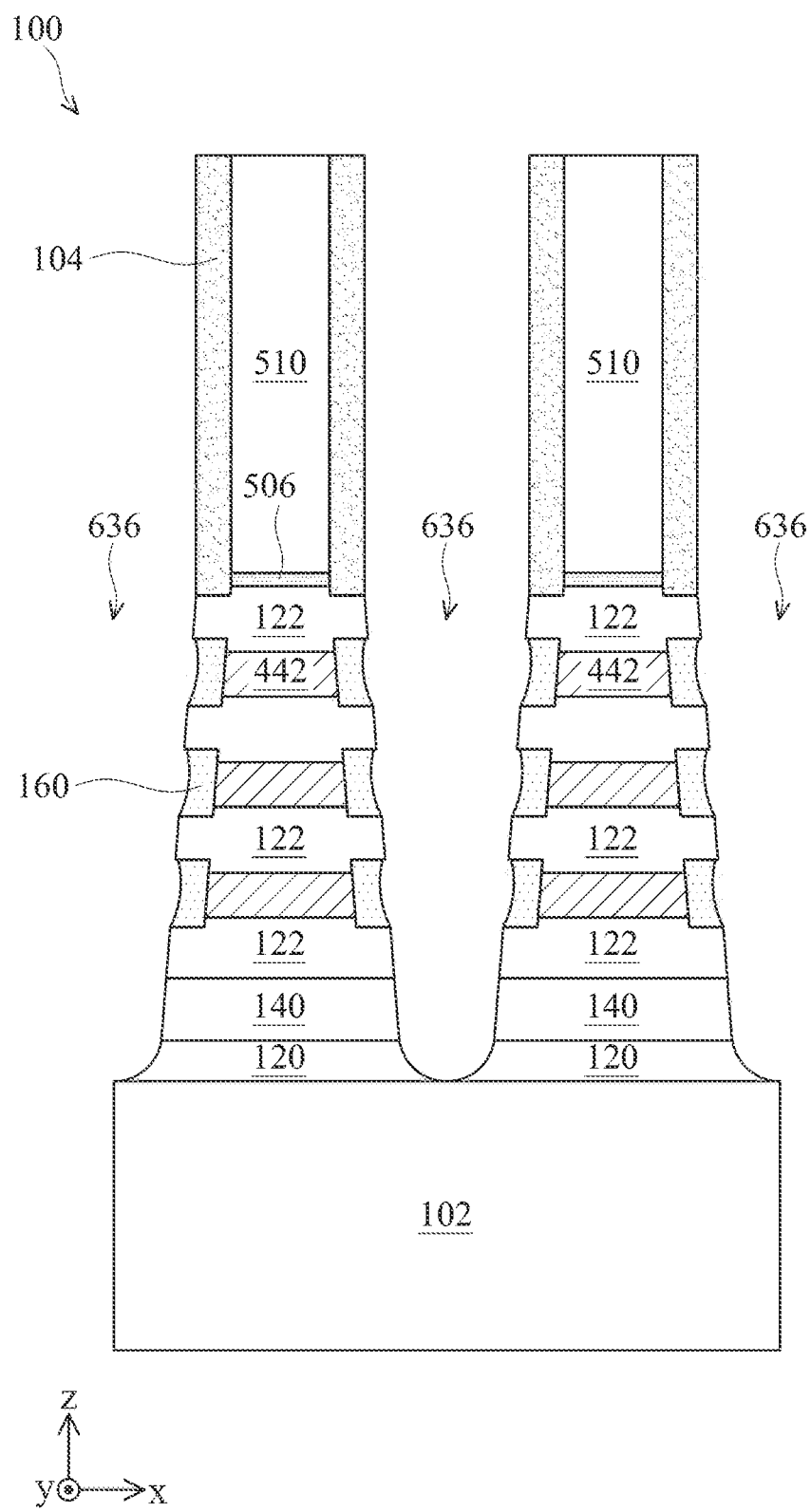

As shown in FIG. 12, the process of replacing second sacrificial layer 440 with buried dielectric layer 140 can further include performing a dry etching process to etch portions dielectric layer 1140 in recess structure 636 to expose inner spacers 160 and channel region 122's side surface 122S, with another portion of dielectric layer 1140 that occupies cavity structure 1040 being defined as buried dielectric layer 140. In some embodiments, the dry etching process for etching dielectric layer 1140 can be a plasma-free dry etching process (e.g., providing the dry etchant gases to chemically react with dielectric layer 1140 without applying a radio-frequency power to generate ions). In some embodiments, the dry etching process can be a radical etching process. In some embodiments, the dry etching process for etching dielectric layer 1140 can selectively etch dielectric layer 1140 over channel region 122 with an etching selectivity from about 5 to about 50, from about 5 to about 30, or from about 5 to about 20. If the above-noted etching selectivity is below the above-noted lower limits, channel region 122's side surface 122S may be damaged by the dry/wet etching process, thus causing FET 101's leakage current. If the above-noted etching selectivity is beyond the above-noted upper limits, the resulting dielectric buried layer 140 may have an insufficient horizontal (e.g., in the x-direction) dimension to avoid leakage current between FET 101's source and drain terminals.

Figure 13:
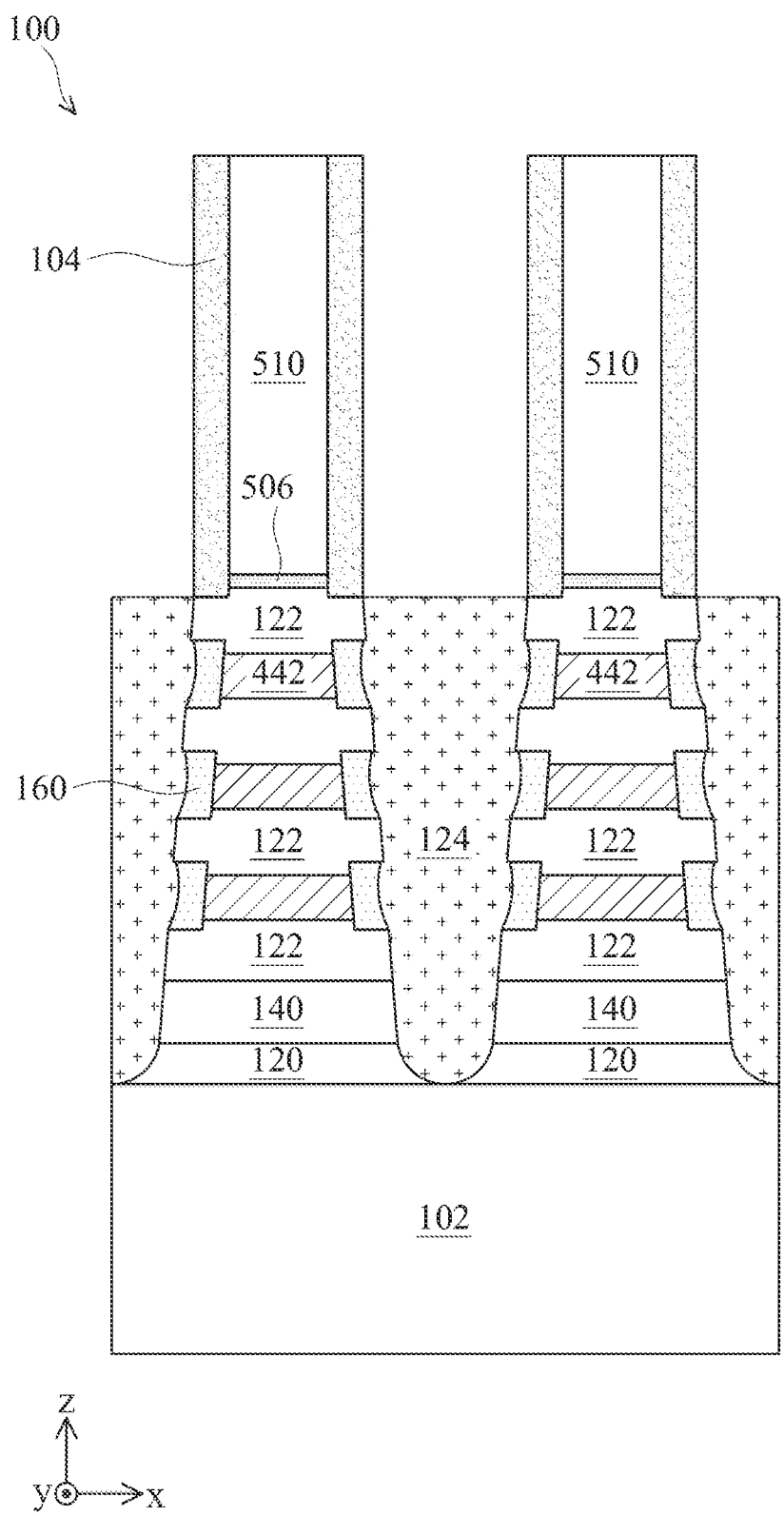
Figure 14:
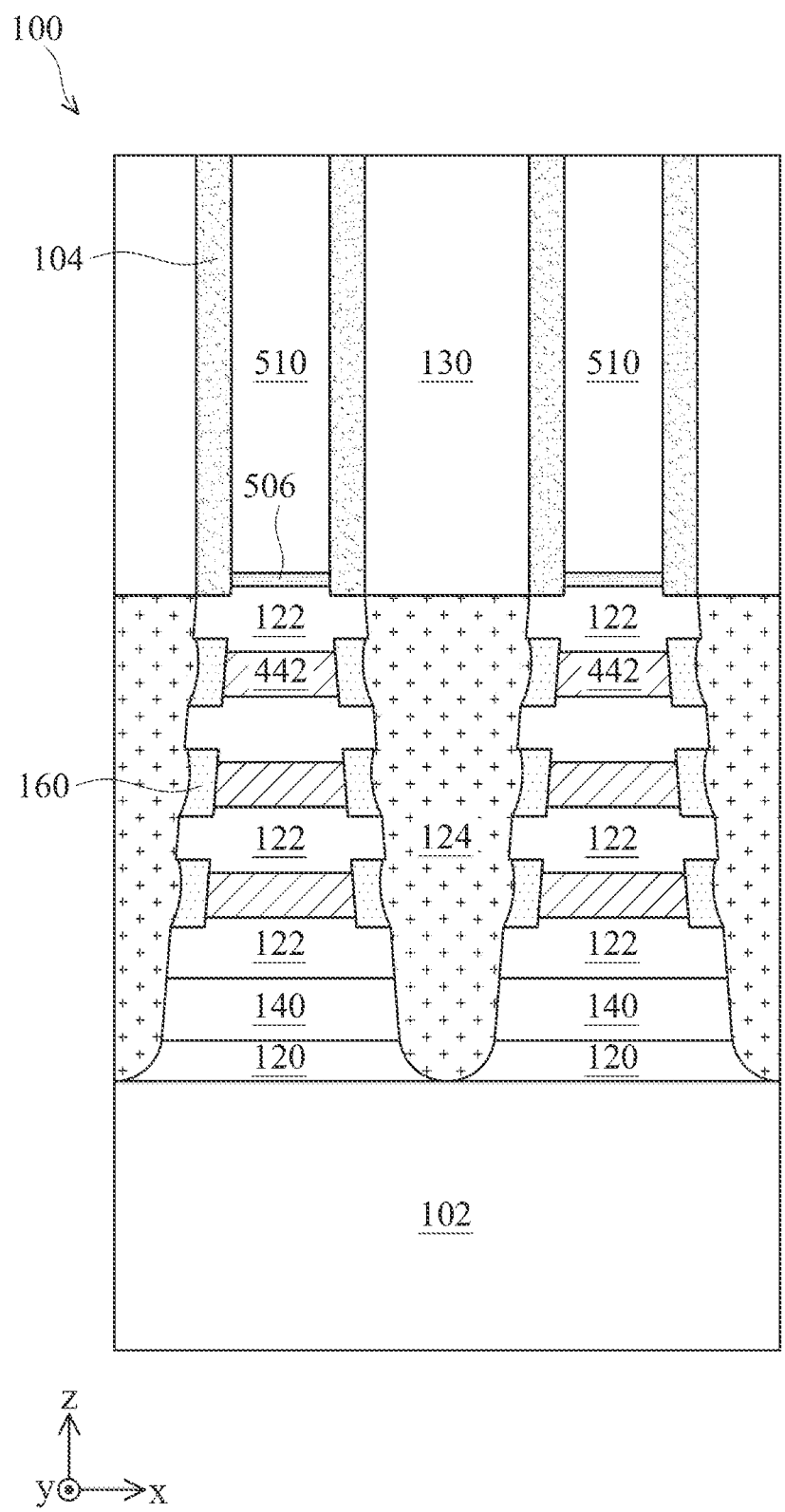

Referring to FIG. 3, in operation 330, a source/drain (S/D) region and a metal gate structure is formed. For example, as shown in FIGS. 1 and 2, S/D region 124 can be formed over inner spacers 160 and channel regions 122, and gate structure 110 can be formed over fin structure 108 with references to FIGS. 13-17. As shown in FIG. 13, the process of forming S/D region 124 can include epitaxially growing S/D region 124 in the structure of FIG. 12 using an epitaxial growth process, such as a CVD process, a LPCVD process, a RTCVD process, a MOCVD process, an ALCVD process, a UHVCVD process, a RPCVD process, an MBE process, a CDE process, and an SEG process. The epitaxial growth process can be performed using suitable precursors, such as silane ($SiH_4$), disilane ($Si_2H_6$), dichlorosilane (DCS), and germane ($GeH_4$). The epitaxial growth process can further include doping S/D region 124 using suitable dopant precursors, such as diborane ($B_2H_6$), boron trifluoride ($BF_3$), phosphine ($PH_3$), and arsine ($AsH_3$). Accordingly, the resulting S/D region 124 can be grown over and in contact with channel regions 122 under sacrificial gate structure 510 and gate spacers 104. The resulting S/D region 124 can be further grown over and in contact with inner spacers 160 that are vertically (e.g., in the z-direction) sandwiched by two vertical (e.g., in the z-direction) channel regions 122. The resulting S/D region 124 can be further grown over and in contact with buried dielectric layer 140 that are vertically (e.g., in the z-direction) sandwiched by the bottommost channel region 122 and buffer region 120. Based on the disclosure herein, other epitaxial growth processes for forming S/D region 124 are within the spirit and scope of this disclosure.

Referring to FIGS. 14-17, the process of forming gate structure 110 can include (i) forming ILD layer 130 (shown in FIG. 14) coplanarized with sacrificial gate structures 510 of FIG. 13 using a suitable deposition process, such as a PVD process and a CVD process, and a suitable etch back process, such as a chemical mechanical polishing (CMP) process; (ii) removing sacrificial gate structure 510 to form recess structures 1536 (shown in FIG. 15) to expose dielectric layer 506 using an etching process; and (iii) removing dielectric layer 506 to expose sacrificial layers 422 using an etching process. In some embodiments, the etching process for forming recess structure 1536 can include a dry etching process that uses chlorine, fluorine or bromine as gas etchants. In some embodiments, the etching process for forming recess structure 1536 can include a wet etching process that uses an ammonium hydroxide ($NH_4OH$), sodium hydroxide (NaOH), or potassium hydroxide (KOH) as wet etchants. In some embodiments, the etching process for removing dielectric layer 506 can include a dry etching process that uses chlorine, fluorine or bromine as gas etchants. In some embodiments, the etching process for removing dielectric layer 506 can include a wet etching process that uses a hydrogen fluoride (HF) as wet etchants.

Figure 15:
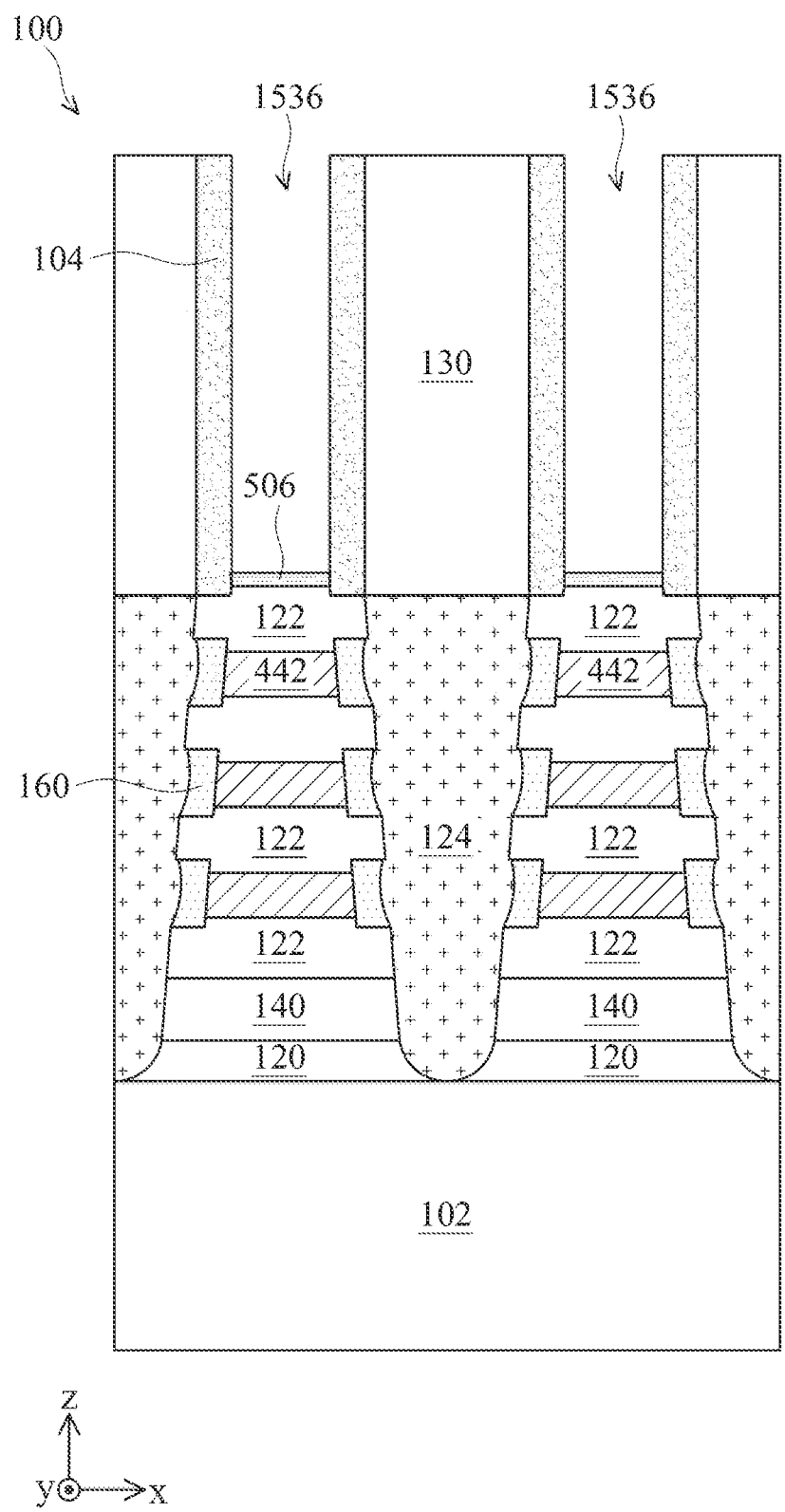
Figure 16:
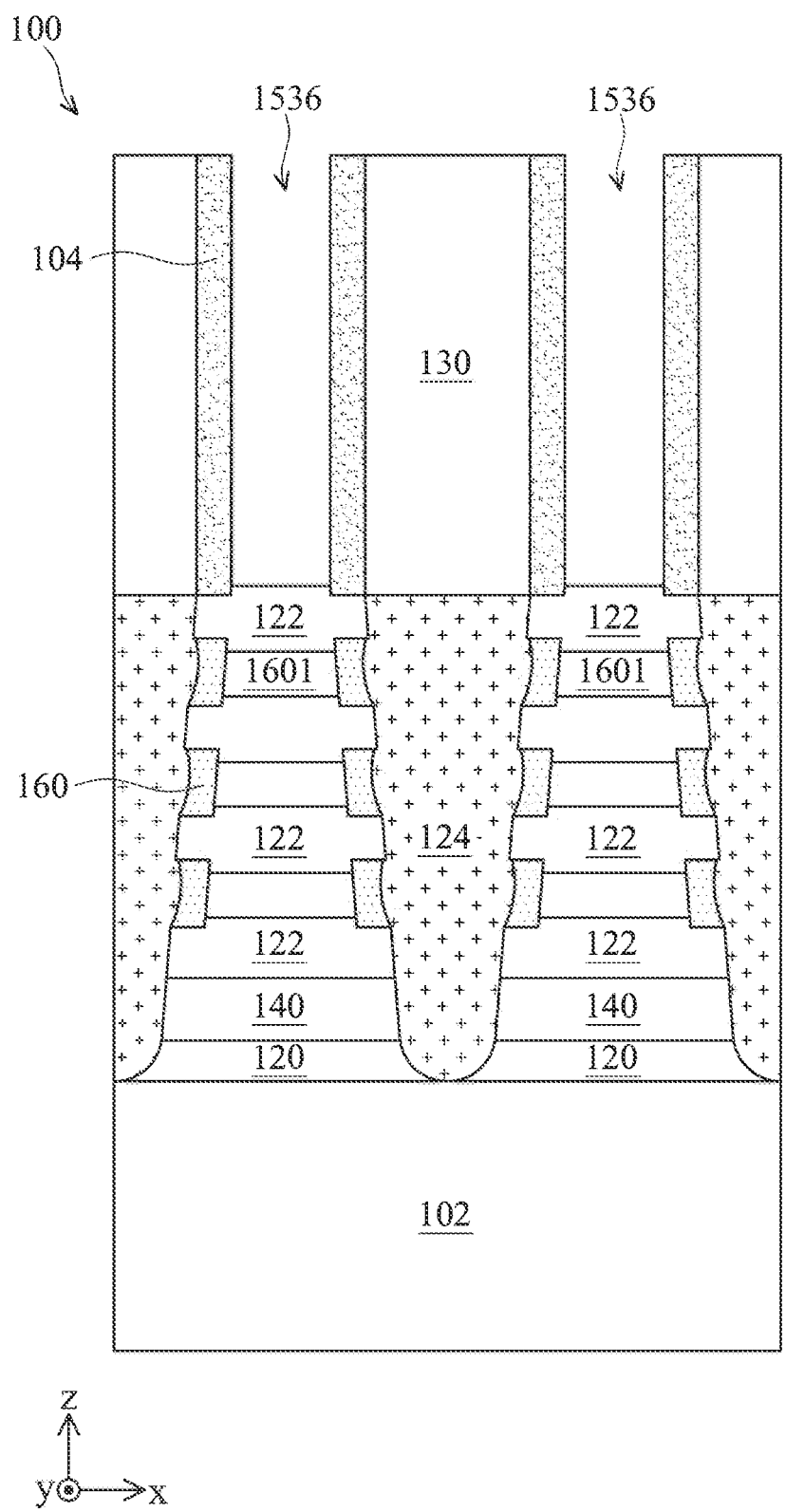
Figure 17:
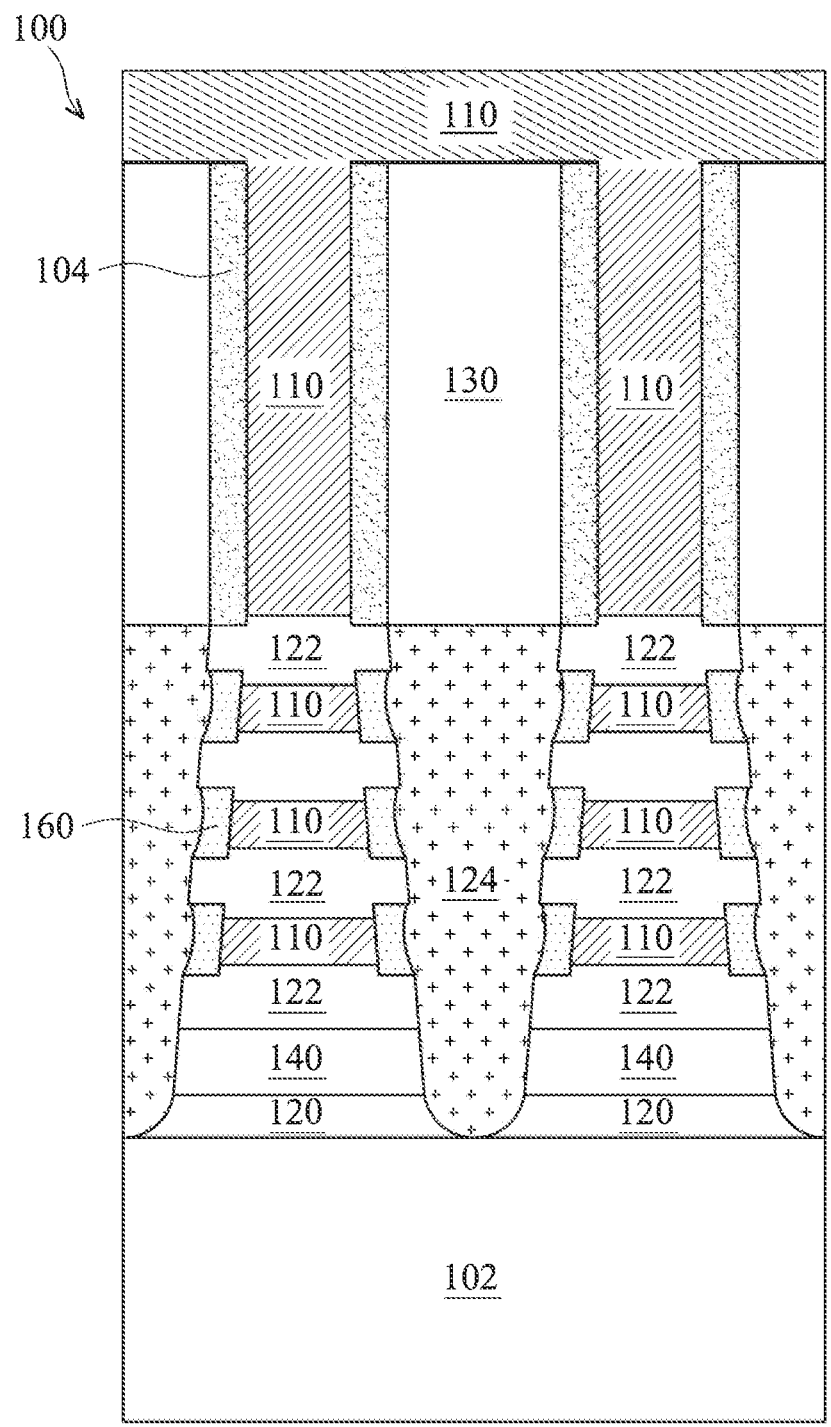

The process of forming gate structure 110 can further include (i) removing sacrificial layers 422 of FIG. 15 to form recess structures 1601 (shown in FIG. 16) using a plasma etching process or a radical etching process; (ii) filling gate structure 110 (shown in FIG. 17), such as a gate dielectric layer (not shown in FIG. 17) and a gate electrode (not shown in FIG. 17) in the recess structures 1536 and 1601 of FIG. 16 using a suitable deposition process, such as an ALD process and a CVD process; and (iii) coplanarizing the filled gate structure 110 of FIG. 17 with ILD layer 130 using a suitable etch back process, such as a CMP process, to define gate structure 110 of FIG. 2. Based on the disclosure herein, other processes for forming gate structure 110 are within the spirit and scope of this disclosure.

The present disclosure provides an exemplary transistor inner spacer and a method for forming the same. The method of forming the inner spacer can include forming a fin structure that includes a top sacrificial layer and a bottom sacrificial layer. The top sacrificial layer can have a greater germanium concentration than the bottom sacrificial layer. The method of forming the inner spacer can further include performing a radical etching process to selectively etch the top sacrificial layer over the bottom sacrificial layer at the fin structure. The radical etching process can be a hydrogen-free radical etching process. Further, the radical etching process can apply a fluorine-containing radical, such as a F radical, to react with the top sacrificial layer with an activation energy less than reacting with the bottom sacrificial layer. Accordingly, the radical etching process can selective etch the top sacrificial layer over the bottom sacrificial layer with an etching selectivity greater than about 5, such as from about 5 to about 100. The above-noted enhanced etching selectivity allows the radical etching process to selectively recess the top sacrificial layer's side surface without damaging the bottom side surface's side surface. Hence, the method of forming the inner spacer can selectively pattern the inner spacer over the top sacrificial layer with the bottom sacrificial layer being exposed. After the process of forming the inner spacer, the exposed bottom sacrificial layer can react with etchants of subsequent etching processes to be replaced with a buried dielectric layer. A benefit of the present disclosure, among others, is to provide a hydrogen-free radical etching method to selectively form the inner spacer on the top sacrificial layer to enhance the yield and reliability of patterning the buried dielectric layer, thus improving the semiconductor device's reliability and performance.

In some embodiments, a method can include forming a fin structure over a substrate. The fin structure can include first and second sacrificial layers. The method can further include forming a recess structure in a first portion of the fin structure, selectively etching the first sacrificial layer of a second portion of the fin structure over the second sacrificial layer of the second portion of the fin structure, and forming an inner spacer layer over the etched first sacrificial layer with the second sacrificial layer of the second portion of the fin structure being exposed.

In some embodiments, a method can include forming first and second sacrificial layers over a substrate, forming a recess structure to expose the first and second sacrificial layers, selectively etching the exposed first sacrificial layer over the exposed second sacrificial layer, and forming an inner spacer layer to cap the etched first sacrificial layer over the exposed second sacrificial layer.

In some embodiments, a semiconductor structure can include a substrate and a fin structure formed over the substrate. The fin structure can include a channel region and a buried dielectric layer formed under the channel region. The semiconductor structure can further include a gate structure formed over the channel region, and first and second source/drain (S/D) regions formed in the fin structure and separated from the gate structure. The buried dielectric layer can be in contact with the first and second S/D regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure over a substrate, wherein the fin structure comprises first and second sacrificial layers;
    forming a recess structure in a first portion of the fin structure;
    selectively etching the first sacrificial layer of a second portion of the fin structure over the second sacrificial layer of the second portion of the fin structure; and
    forming an inner spacer layer over the etched first sacrificial layer with the second sacrificial layer of the second portion of the fin structure being exposed.

2. The method of claim 1, wherein selectively etching the first sacrificial layer over the second sacrificial layer comprises performing a radical etching process to selectively etch the first sacrificial layer over the second sacrificial layer with an etching selectivity from about 10 to about 100.

3. The method of claim 1, wherein selectively etching the first sacrificial layer over the second sacrificial layer comprises performing a hydrogen-free radical etching process to selectively etch the first sacrificial layer exposed by the recess structure over the second sacrificial layer exposed by the recess structure.

4. The method of claim 3, wherein performing the hydrogen-free radical etching process comprises flowing a fluorine-containing processing gas.

5. The method of claim 1, wherein selectively etching the first sacrificial layer over the second sacrificial layer comprises performing an etching process at a temperature from about −90° C. to about 15° C. to selectively etch the first sacrificial layer exposed by the recess structure over the second sacrificial layer exposed by the recess structure.

6. The method of claim 1, wherein forming the fin structure comprises forming the first sacrificial layer with a first germanium concentration and forming the second sacrificial layer with a second germanium concentration less than the first germanium concentration.

7. The method of claim 1, wherein forming the inner spacer layer comprises:
    forming a dielectric layer over first and second side surfaces of the first and second sacrificial layers, respectively; and
    etching the dielectric layer to expose the second side surface with the first side surface masked by the dielectric layer.

8. A method, comprising:
    forming first and second sacrificial layers over a substrate;
    forming a recess structure to expose the first and second sacrificial layers;
    selectively etching the exposed first sacrificial layer over the exposed second sacrificial layer; and
    forming an inner spacer layer to cap the etched first sacrificial layer over the exposed second sacrificial layer.

9. The method of claim 8, wherein selectively etching the exposed first sacrificial layer over the exposed second sacrificial layer comprises performing a radical etching process to selectively etch the first sacrificial layer over the second sacrificial layer with an etching selectivity from about 10 to about 100.

10. The method of claim 8, wherein selectively etching the exposed first sacrificial layer over the second exposed sacrificial layer comprises performing a hydrogen-free radical etching process to selectively etch the first sacrificial layer over the second sacrificial layer.

11. The method of claim 10, wherein performing the hydrogen-free radical etching process comprises flowing a fluorine-containing processing gas.

12. The method of claim 8, wherein selectively etching the exposed first sacrificial layer over the second exposed sacrificial layer comprises performing an etching process at a temperature from about −90° C. to about 15° C. to selectively etch the first sacrificial layer over the second sacrificial layer.

13. The method of claim 8, wherein forming the first and second sacrificial layers comprises forming the first sacrificial layer with a first germanium concentration and forming the second sacrificial layer with a second germanium concentration less than the first germanium concentration.

14. The method of claim 8, wherein forming the inner spacer layer comprises:
    forming a dielectric layer over first and second side surfaces of the first and second sacrificial layers, respectively; and
    etching the dielectric layer to expose the second side surface with the first side surface masked by the dielectric layer.

15. A method, comprising:
    forming a first sacrificial layer on a substrate;
    forming a stack of nanostructured layers and second sacrificial layers in an alternating configuration on the first sacrificial layer;
    forming a polysilicon structure on the stack of nanostructured layers and second sacrificial layers;
    forming an opening extending through the stack of nanostructured layers and second sacrificial layers and through the first sacrificial layer;
    replacing the first sacrificial layer entirely with a dielectric layer;
    forming a source/drain region in the opening; and
    replacing the polysilicon structure and the second sacrificial layers with a gate structure.

16. The method of claim 15, wherein forming the first sacrificial layer comprises epitaxially growing a silicon germanium layer on the substrate.

17. The method of claim 15, wherein replacing the first sacrificial layer comprises etching the first sacrificial layer to form a cavity between the substrate and the stack of nanostructured layers and second sacrificial layers.

18. The method of claim 17, wherein replacing the first sacrificial layer further comprises depositing the dielectric layer to fill the cavity.

19. The method of claim 15, further comprising etching the second sacrificial layers through the opening prior to replacing the first sacrificial layer.

20. The method of claim 15, further comprising forming inner spacers along sidewalls of the second sacrificial layers prior to replacing the first sacrificial layer.

* * * * *

UNITED STATES PATENT AND TRADEMARK OFFICE
CERTIFICATE OF CORRECTION

PATENT NO. : 12,218,219 B2
APPLICATION NO. : 17/459788
DATED : February 4, 2025
INVENTOR(S) : Chang et al.

Page 1 of 1

It is certified that error appears in the above-identified patent and that said Letters Patent is hereby corrected as shown below:

In the Specification

In Column 7, Line 30, delete "(e.g., $Si_{0.8}sGe_{0.15}$)," and insert -- (e.g., $Si_{0.85}Ge_{0.15}$), --, therefor.

In Column 10, Line 28, delete "(e.g., $Si_{0.8}sGe_{0.15}$)," and insert -- (e.g., $Si_{0.85}Ge_{0.15}$), --, therefor.

Signed and Sealed this
Fifteenth Day of April, 2025

Coke Morgan Stewart
*Acting Director of the United States Patent and Trademark Office*